(12) United States Patent
Nakahata et al.

(10) Patent No.: US 8,405,091 B2
(45) Date of Patent: Mar. 26, 2013

(54) DISPLAY DEVICE AND METHOD OF MANUFACTURING THE SAME

(75) Inventors: Takumi Nakahata, Tokyo (JP); Kazunori Inoue, Tokyo (JP); Koji Oda, Tokyo (JP); Naoki Nakagawa, Tokyo (JP); Nobuaki Ishiga, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 282 days.

(21) Appl. No.: 12/523,550

(22) PCT Filed: Feb. 4, 2008

(86) PCT No.: PCT/JP2008/051744
§ 371 (c)(1),
(2), (4) Date: Jul. 17, 2009

(87) PCT Pub. No.: WO2008/099697
PCT Pub. Date: Aug. 21, 2008

(65) Prior Publication Data
US 2010/0078816 A1    Apr. 1, 2010

(30) Foreign Application Priority Data
Feb. 13, 2007    (JP) .................................. 2007-031995

(51) Int. Cl.
*H01L 27/14* (2006.01)
(52) U.S. Cl. ..... 257/72; 257/59; 257/750; 257/E23.157; 257/E21.159; 349/42; 349/43
(58) Field of Classification Search .................. 349/42, 349/43; 257/59, 72, 750, E23.157, E21.159
See application file for complete search history.

(56) References Cited

U.S. PATENT DOCUMENTS

| 6,252,247 B1 | 6/2001 | Sakata et al. |
| 7,250,788 B2 | 7/2007 | Lee et al. |
| 2005/0224795 A1 | 10/2005 | Gotoh et al. |
| 2006/0163741 A1 | 7/2006 | Bae et al. |

FOREIGN PATENT DOCUMENTS

| JP | 4 253342 | 9/1992 |
| JP | 9 244062 | 9/1997 |
| JP | 11 109417 | 4/1999 |
| JP | 11 284195 | 10/1999 |
| JP | 2001 318389 | 11/2001 |
| JP | 2005 303003 | 10/2005 |
| JP | 2006 107692 | 4/2006 |
| JP | 2006 191013 | 7/2006 |
| KR | 10-1999-0076546 | 10/1999 |
| KR | 10-2006-0081470 | 7/2006 |

OTHER PUBLICATIONS

Office Action issued Sep. 28, 2011, in Korean Patent Application No. 10-2009-7016788 with partial English translation.

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

A display device includes a metal conductive layer formed on a substrate, a transparent electrode film formed on the substrate and joined to the metal conductive layer and an interlayer insulating film isolating the metal conductive layer and the transparent conductive film. The metal conductive layer has a lower aluminum layer made of aluminum or aluminum alloy, an intermediate impurity containing layer made of aluminum or aluminum alloy containing impurities and formed on a substantially entire upper surface of the lower aluminum layer and an upper aluminum layer made of aluminum or aluminum alloy and formed on the intermediate impurity containing layer. In the interlayer insulating film and the upper aluminum layer, a contact hole penetrates therethrough and locally exposes the intermediate impurity containing layer, and the transparent electrode film is joined to the metal conductive layer in the intermediate impurity containing layer exposed from the contact hole.

2 Claims, 44 Drawing Sheets

FIG. 10
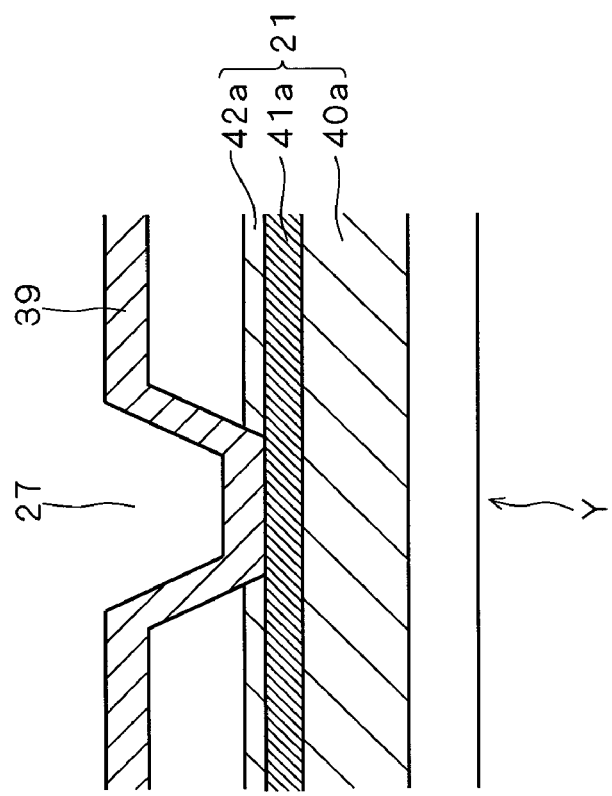
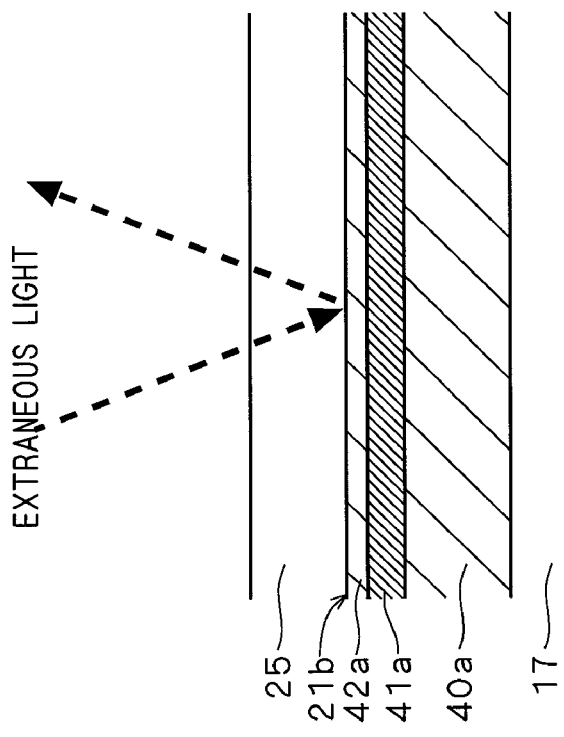

FIG. 16
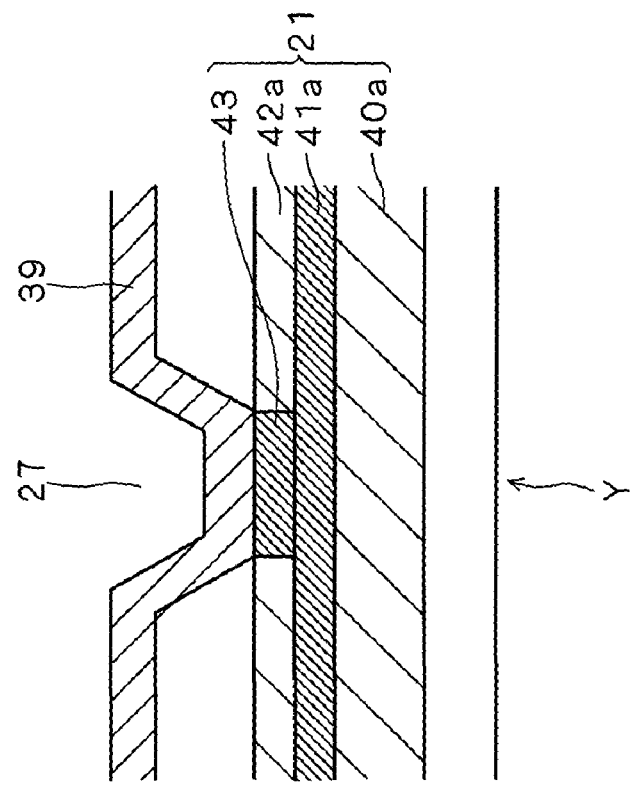
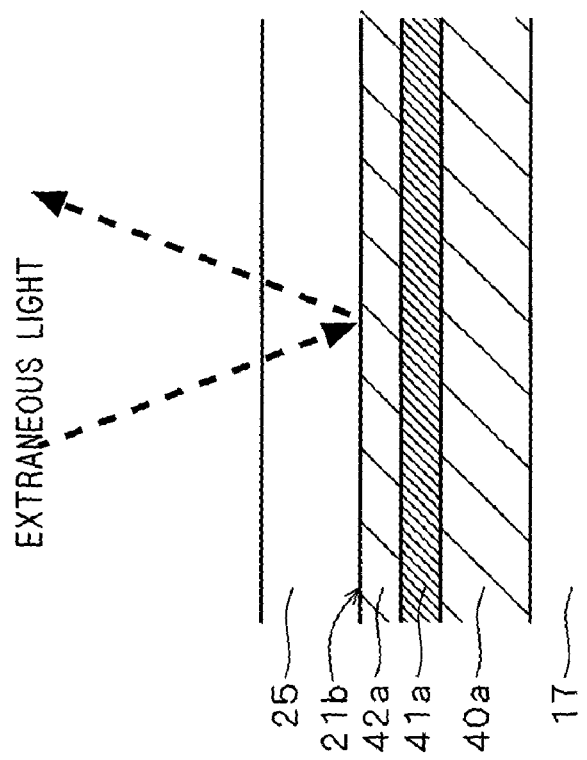

FIG. 23
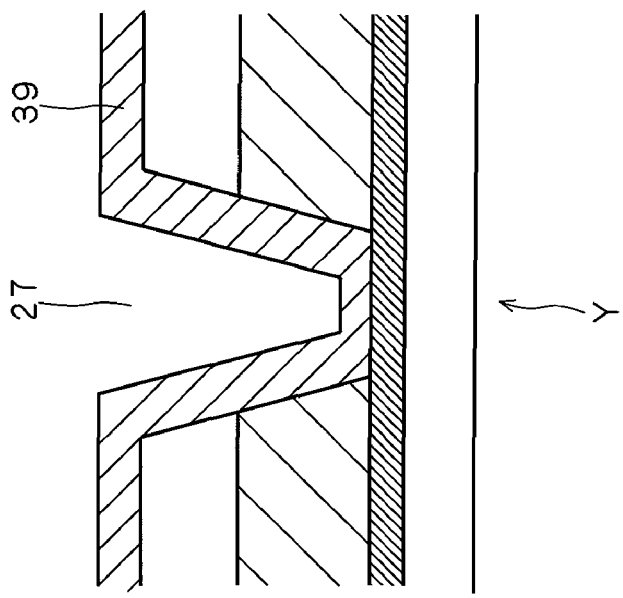
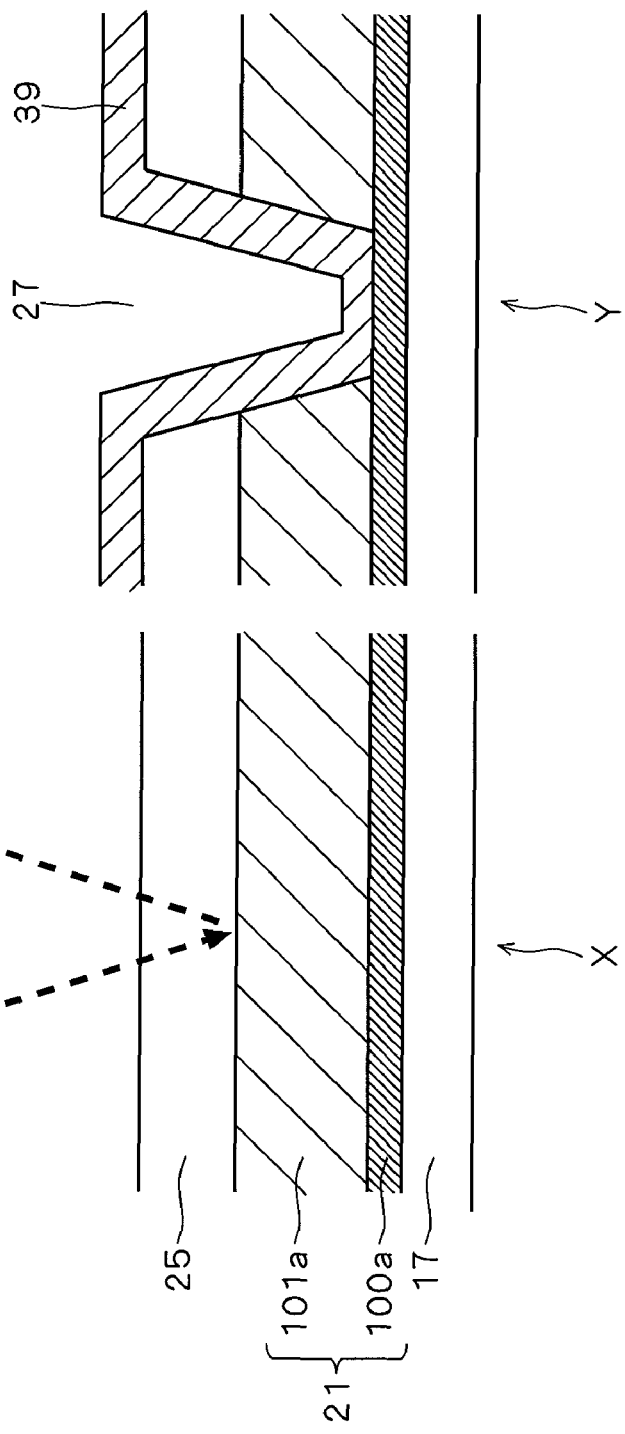

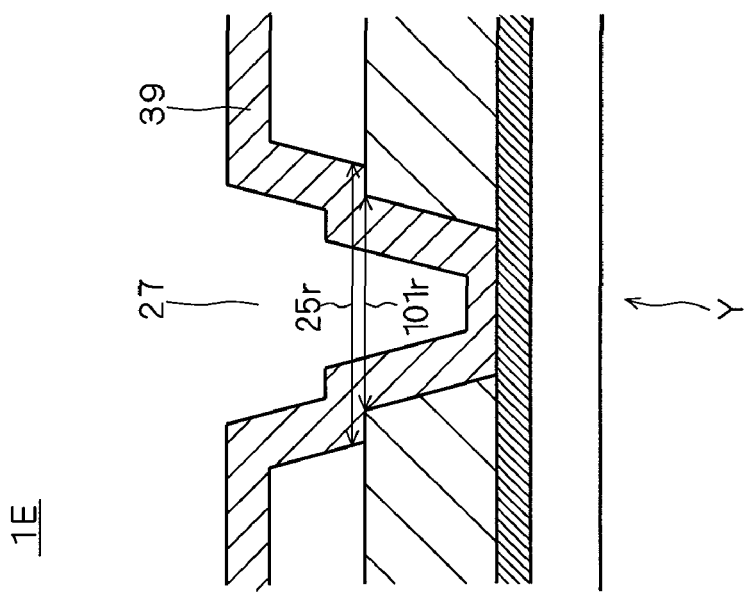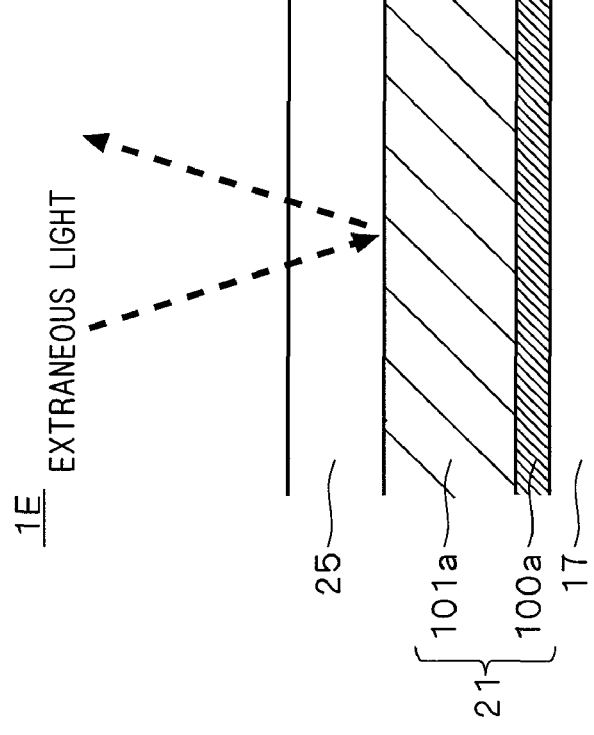

F I G. 3 0
(a) 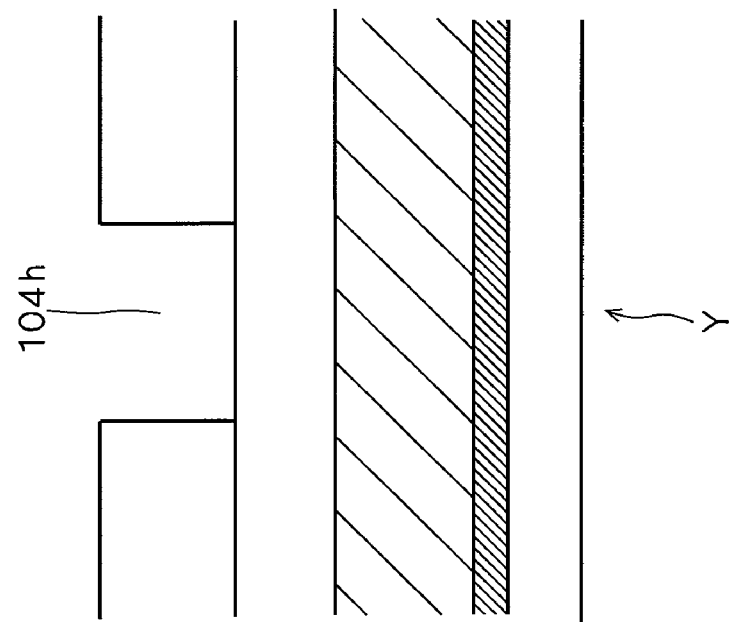
(b) 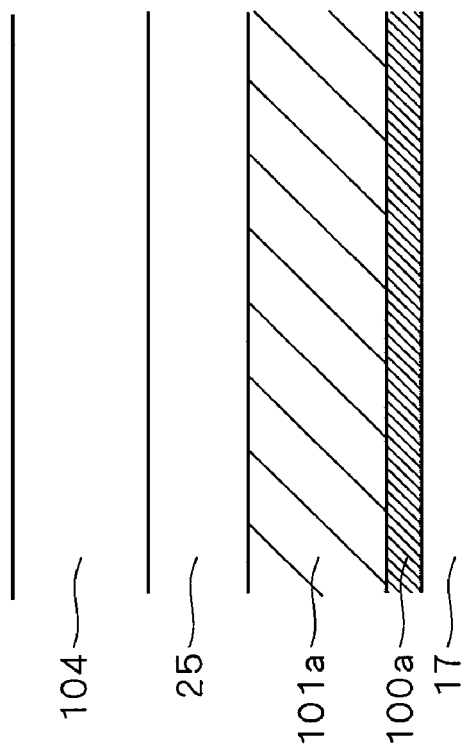

F I G. 3 1
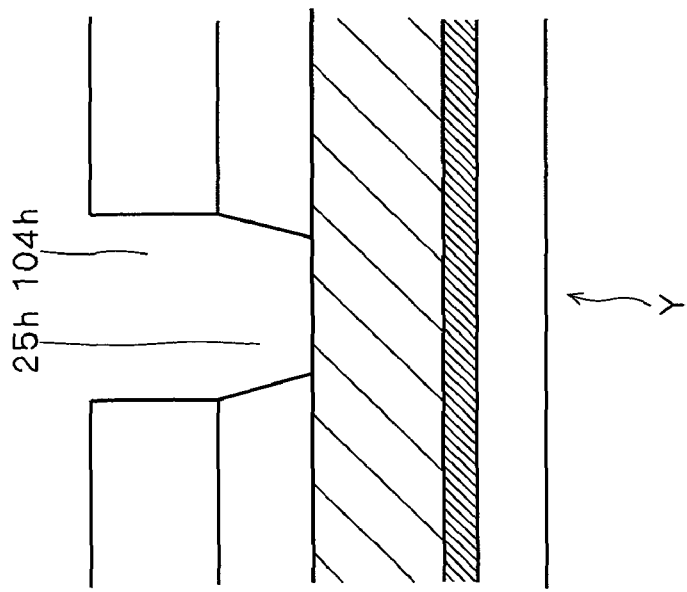
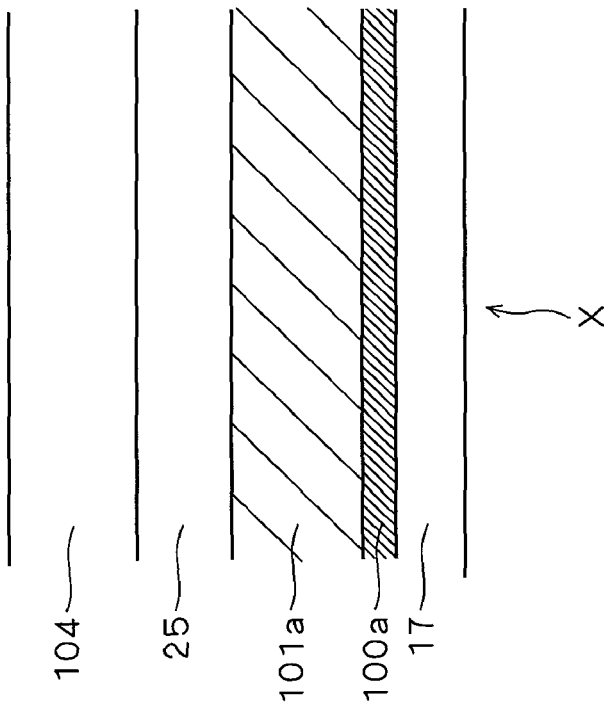

F I G. 34
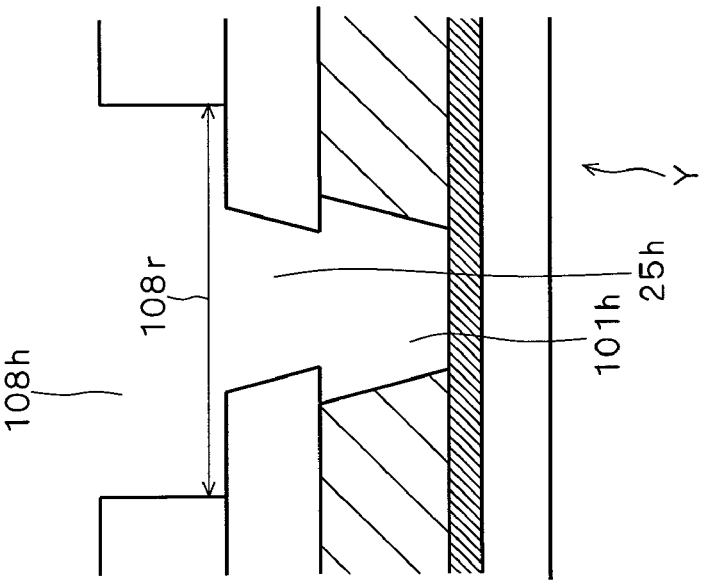
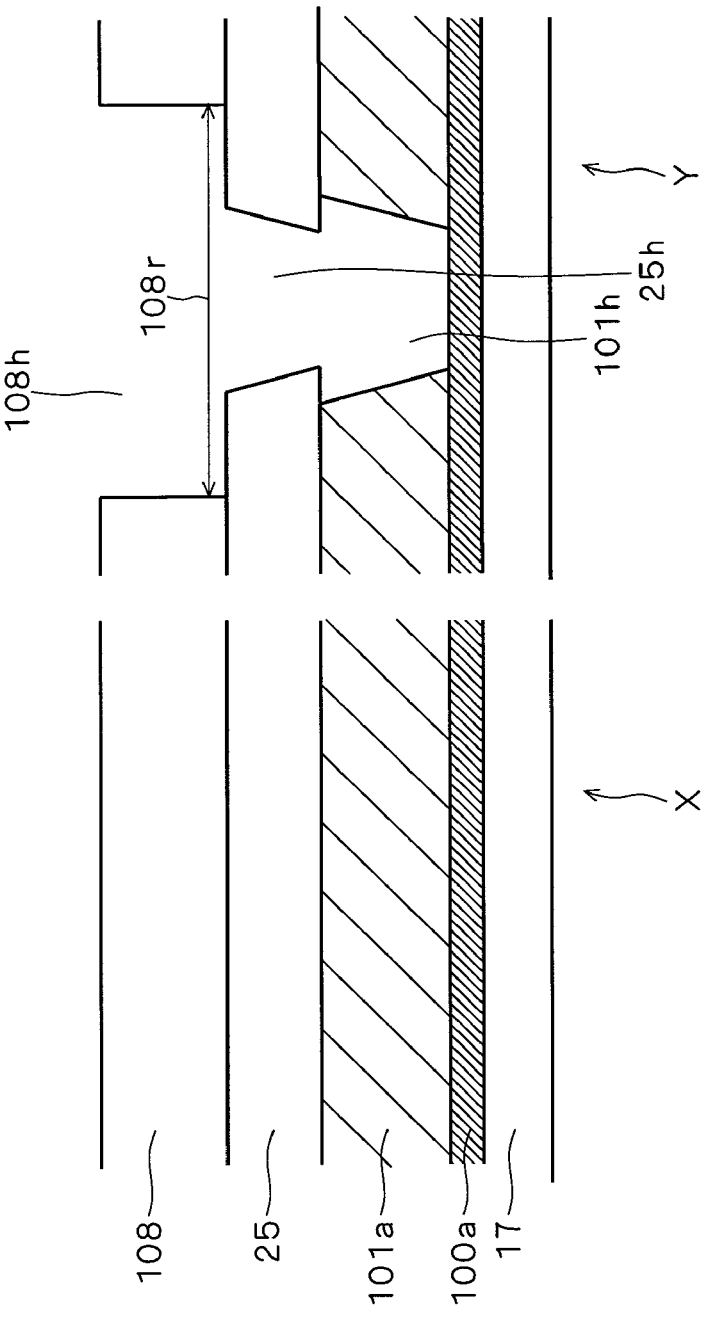

FIG. 35
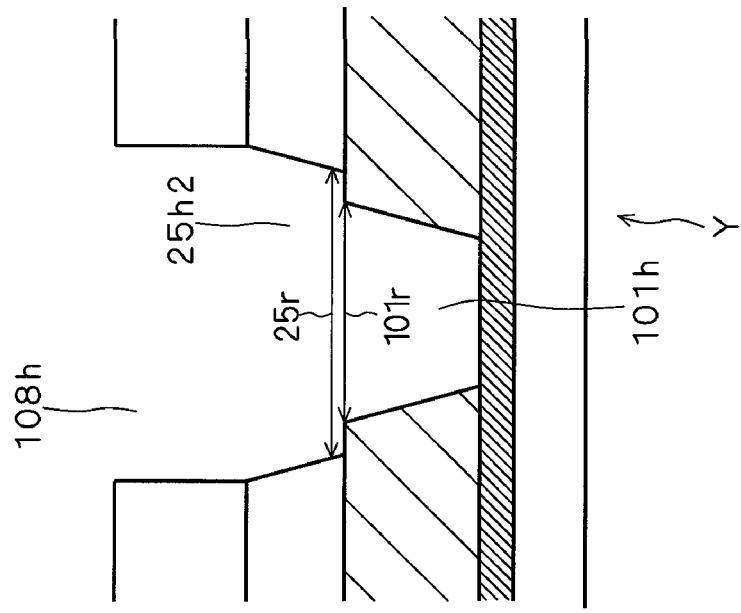
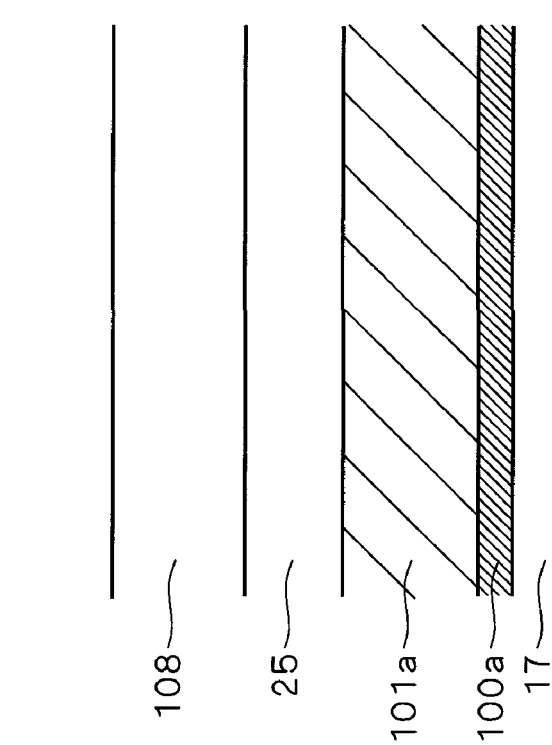

FIG. 38
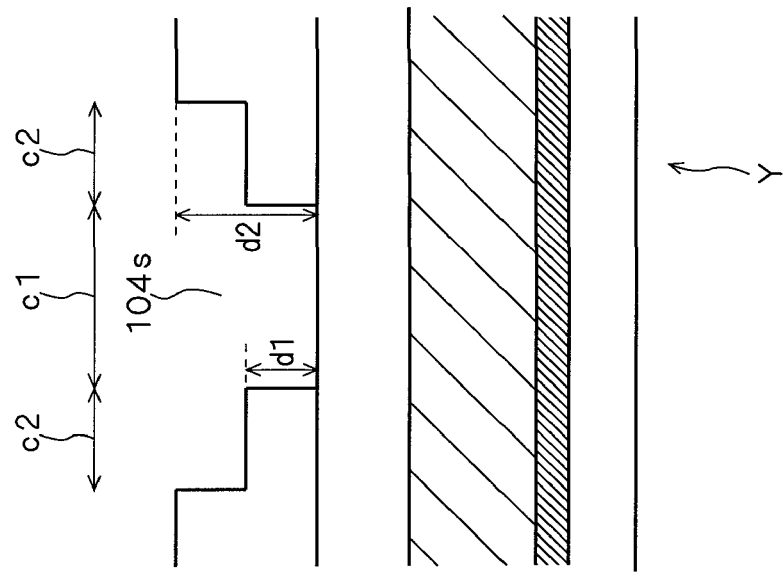
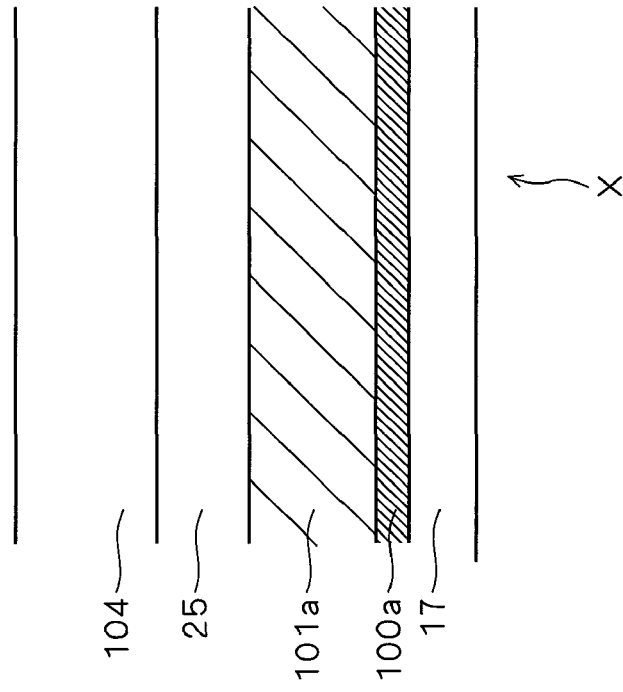

F I G. 3 9
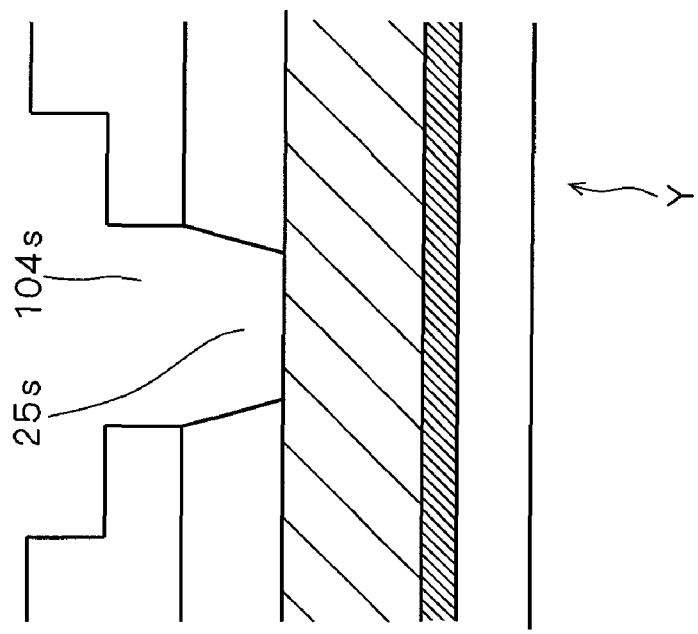
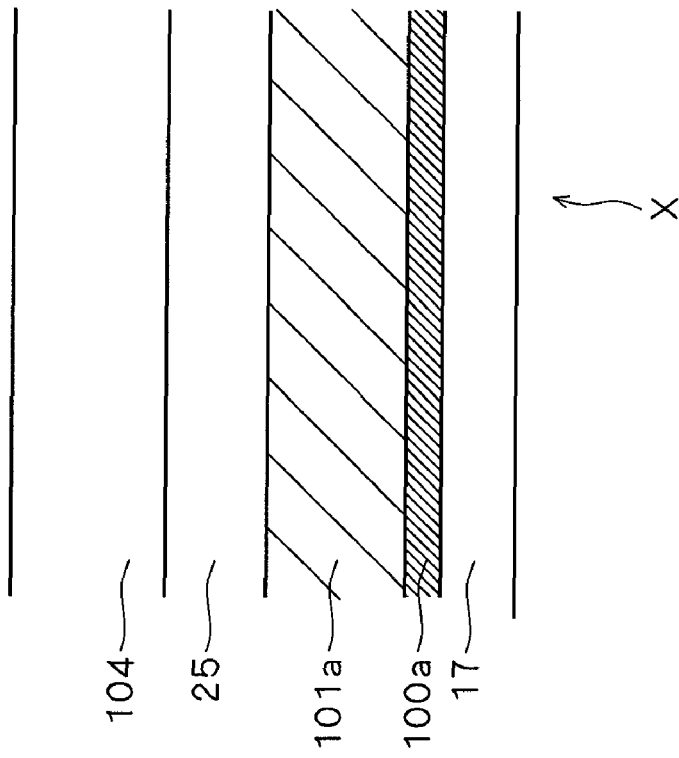

F I G . 4 0
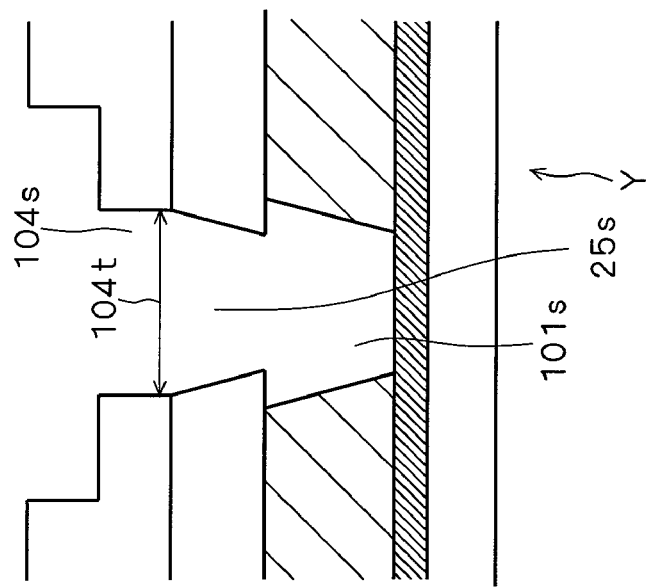
(a)
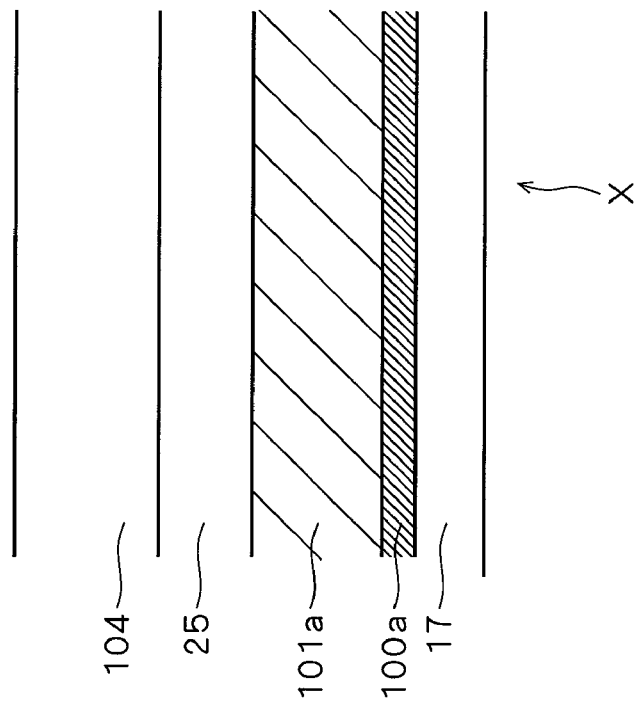
(b)

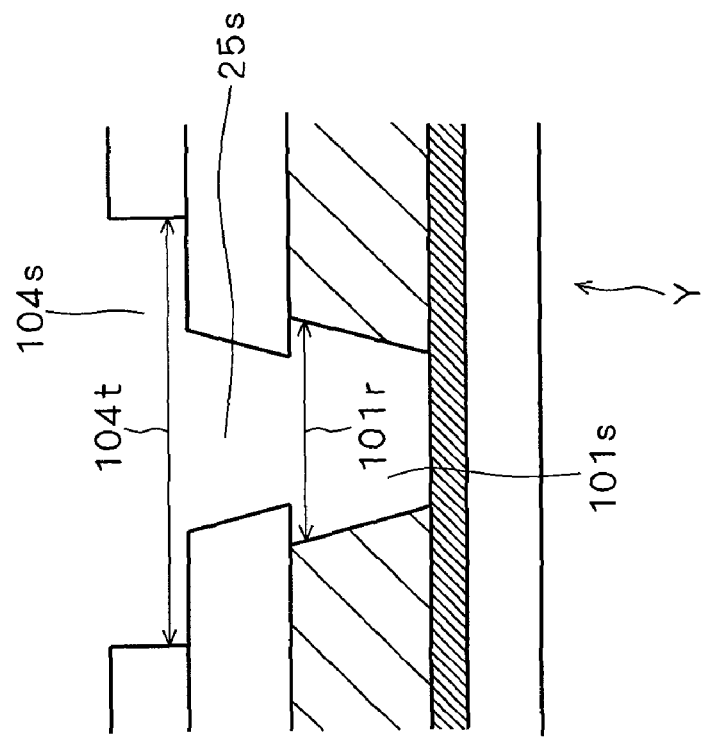
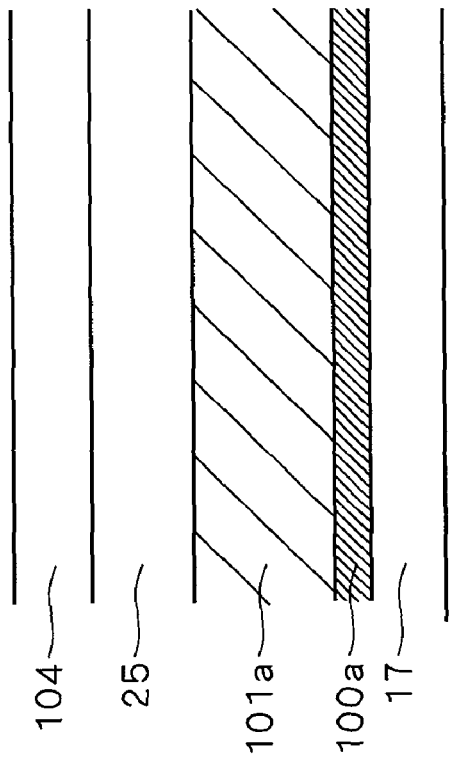
FIG. 41

FIG. 42
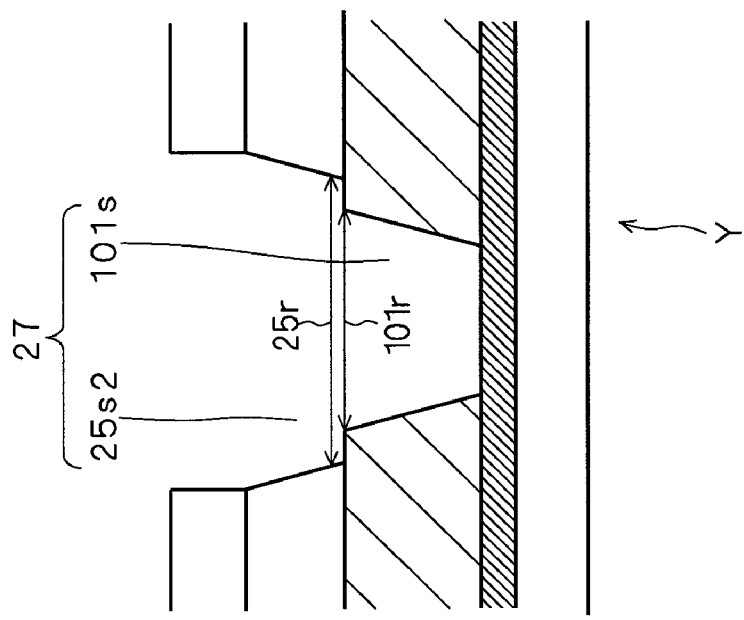
(a)
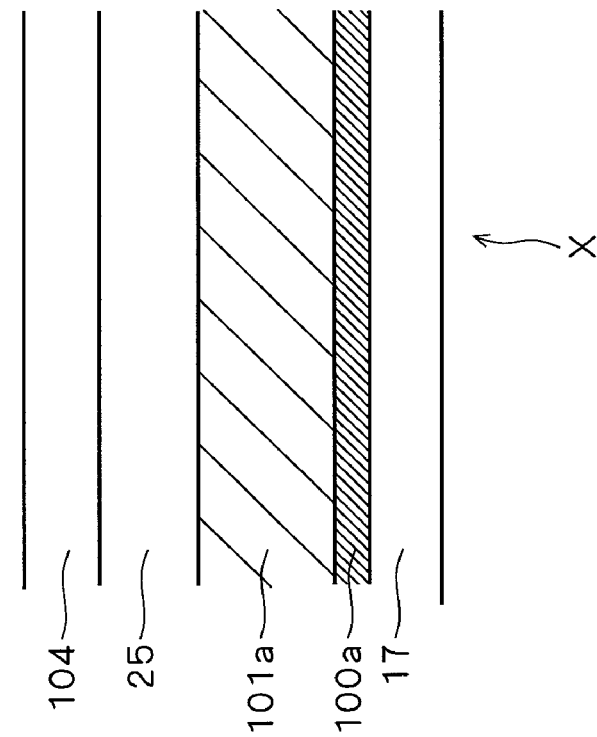
(b)

FIG. 43
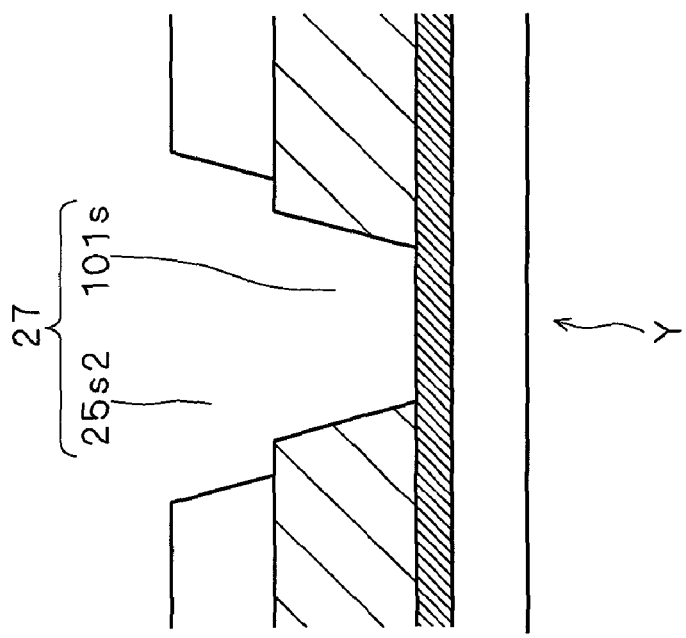
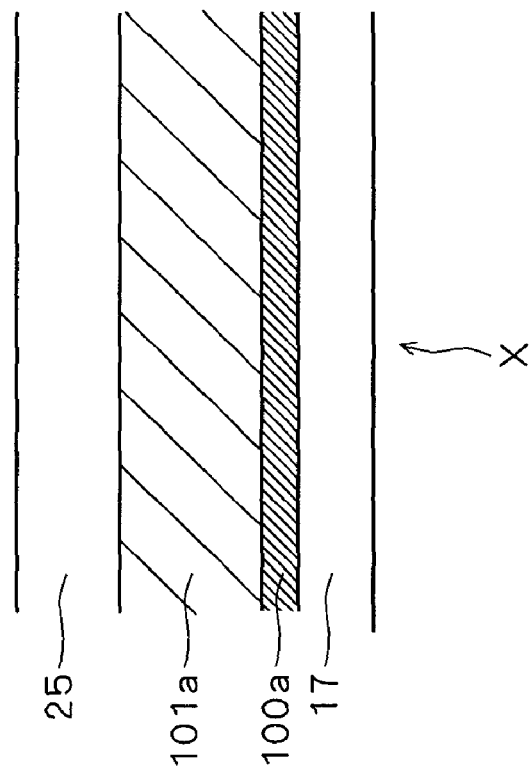

DISPLAY DEVICE AND METHOD OF MANUFACTURING THE SAME

TECHNICAL FIELD

The present invention relates to a display device such as an active matrix display, and more particularly to a thin film transistor array substrate (hereinafter, referred to as TFT array substrate) including a thin film transistor (hereinafter, referred to as TFT), which is used as a switching element, and a method of manufacturing the same.

BACKGROUND ART

Electrooptic devices for display using liquid crystals, electroluminescences or the like are actively applied to products exploiting such features as low power consumption and thin type, as one of flat panel displays which are alternatives to CRTs.

A liquid crystal display, for example, usually comprises a liquid crystal panel in which a liquid crystal layer is held between a TFT array substrate and a counter substrate having a color filter, and a polarizing plate provided in the liquid crystal panel, and further comprises a back light unit and a light source which are provided outside one of the substrates. Light from the light source is emitted by using the back light unit to the polarizing plate and the liquid crystal panel and passes therethrough, to thereby achieve an image of color display. An electroluminescence display device comprises a light emitting film using electroluminescence and a counter electrode which are provided on a TFT array substrate, and achieves display light by passing a current through the light emitting film.

On the TFT array substrate, a TFT and a pixel electrode are arranged in matrix. A drain electrode of the TFT and the pixel electrode are isolated from each other by an interlayer insulating film and joined to each other through a contact hole formed in the interlayer insulating film.

As a material of the pixel electrode, usually, a transparent conductive material such as indium oxide, zinc oxide or the like is used. In such a case, if aluminum or an aluminum alloy is used as a material of the drain electrode, an oxide layer is formed at a junction with the transparent conductive material and this increases the contact resistance at the junction. For this reason, as the material of the drain electrode, a refractory metal having a reducing power, such as chromium or titanium, is used in most cases.

As display devices using liquid crystal, electroluminescence or the like are substituted for other display devices and the scope of application thereof increases, there has been an increase in the requirements for upsizing, higher definition and higher intensity of screens. In order to maintain excellent image quality even in a large area screen, it is necessary to suppress an increase in the wire resistance for the wire length as the screen is upsized. When the wire width is made larger in order to reduce the wire resistance, however, the light transmission region (that is, numerical aperture) decreases and this causes a decrease in the luminance. For this reason, it is necessary to use a wire material of low resistance, such as aluminum or an aluminum alloy.

In the case where aluminum or an aluminum alloy is used for the drain electrode (i.e., a wire), the contact resistance increases at the junction with the pixel electrode (i.e., a transparent electrode). In order to solve this problem, proposed is a method in which a conductive layer other than aluminum is formed on a surface of the drain electrode (see, e.g., Patent Document 1). In this method, however, another film formation or patterning is needed to form the conductive layer and this disadvantageously increases the cost.

Another method, other than the above, is proposed, in which the aluminum or the aluminum alloy forming the upmost layer of the drain electrode, which is exposed from the contact hole, is removed by wet etching when the contact hole is formed in the interlayer insulating film (see, e.g., Patent Document 2). When isotropic etching such as wet etching is used, however, side etching proceeds and an inner wall of the contact hole thereby forms an overhanging shape (i.e., an eaves structure), not being in contact with the drain electrode. Therefore, the pixel electrode and the drain electrode are not sufficiently joined to each other and this may cause a conduction failure.

Also in the above another method, another film formation of one layer or patterning is needed, as well as allying of aluminum, to form the conductive layer and this disadvantageously increases the cost.

Further, when the contact hole is formed on the drain electrode (the wire), since the aluminum or the aluminum alloy forming the upmost layer of the drain electrode, which is exposed from the contact hole, is removed (hereinafter, this method is referred to as an "aluminum-removed contact structure"), the electric resistance of the wire thereby increases and this causes a delay in operating speed and degradation in reliability. In order to avoid this, input/output terminals for connection to array peripheral and external circuits and wiring patterns with retrofitted LSI chips are subject to some constraints (see, e.g., circuit diagrams shown in Patent Document 3).

Still another method is proposed, in which impurities are contained in the entire surface layer of the drain electrode (the wire) made of aluminum or an aluminum alloy, to thereby suppress formation of the oxide layer at the junction with the pixel electrode (the transparent electrode) (see, e.g., Patent Document 4, and hereinafter, this method is referred to as a "surface-layer impurity containing aluminum structure"). This method does not cause an increase in the cost, nor does not cause an increase in the electric resistance or any conduction failure.

Further, in order to give constraint on power consumption and increase visibility in bright places, there are some cases where not only a back light but also extraneous light is used as the light source of the liquid crystal display. This is a system in which a reflecting electrode made of a material, such as aluminum or silver, having high reflectance in a visible light region as well as a transparent pixel electrode passing light therethrough is formed in an upper portion of the TFT, to reflect the extraneous light entering the liquid crystal panel from the outside and use the light as a display light (see, e.g., Patent Document 5, and hereinafter, this method is referred to as a "semitransparent liquid crystal display").

Since the reflecting electrode is usually formed in a process step before or after the step of forming the pixel electrode, however, the step of forming the reflecting electrode needs to be added and this disadvantageously increases the cost.

Then, in the above surface-layer impurity containing aluminum structure, if the reflecting electrode is formed at the same time when the wire is formed of aluminum or an aluminum alloy, to thereby manufacture the above semitransparent liquid crystal display, there is no need to add another step of forming the reflecting electrode.

Since introduction of impurities into an aluminum surface layer reduces the reflectance of visible light, however, it is disadvantageously impossible to achieve a semitransparent liquid crystal display of high reflectance. With respect to an incident light having a wavelength of 550 nm, for example, the reflectance is 90% or more when the aluminum or the aluminum alloy is used, but if impurities are introduced, the reflectance decreases to 85% or less.

Patent Document 1: Japanese Patent Application Laid Open No. 4-253342 (page 3, lines 4 to 31, FIG. 1)

Patent Document 2: Japanese Patent Application Laid Open No. 9-244062 (page 5, right column, line 12 to page 7, left column, line 4, FIGS. 5 and 6)

Patent Document 3: Japanese Patent Application Laid Open No. 2006-107692 (FIGS. 19 and 20)

Patent Document 4: Japanese Patent Application Laid Open No. 11-284195 (FIG. 3)

Patent Document 5: Japanese Patent Application Laid Open No. 11-109417 (FIG. 1)

DISCLOSURE OF INVENTION

Problem to be Solved by the Invention

In such a semitransparent liquid crystal display, as discussed above, if the wire and the reflecting electrode are formed separately, this causes an increase in the cost and on the other hand, if the wire and the reflecting electrode are formed at the same time, it is disadvantageously impossible to achieve high reflectance of visible light.

The present invention is intended to solve the above problem, and it is an object of the present invention to provide a display device comprising a reflecting electrode of high reflectance, which reduces the contact resistance at a junction of a wire and a transparent electrode and avoids an increase in the manufacturing cost.

According to a first aspect of the present invention, the display device comprises a metal conductive layer formed on a substrate, a transparent conductive film formed on the same substrate, to be joined to the metal conductive layer, and an interlayer insulating film for isolating the metal conductive layer and the transparent conductive film, and in the display device, the metal conductive layer has a lower aluminum layer made of aluminum or an aluminum alloy, an intermediate impurity containing layer made of aluminum or an aluminum alloy containing impurities and formed on a substantially entire upper surface of the lower aluminum layer, and an upper aluminum layer made of aluminum or an aluminum alloy and formed on the intermediate impurity containing layer, a contact hole is so formed as to penetrate through the interlayer insulating film and the upper aluminum layer and locally expose the intermediate impurity containing layer, and the transparent electrode film is joined to the metal conductive layer in the intermediate impurity containing layer exposed from the contact hole.

By the aspect of the present invention, since the metal conductive layer is formed of aluminum or an aluminum alloy, a wire of low electric resistance can be achieved. Then, since the junction with the transparent conductive film is formed of the impurity containing layer in the surface of the metal conductive layer, it is possible to reduce the contact resistance at the junction of the metal conductive layer and the transparent electrode film.

Further, since the junction with the transparent conductive film is locally formed in the surface of the metal conductive layer (in other words, since the portion other than the junction in the surface of the metal conductive layer is formed of aluminum or an aluminum alloy), the metal conductive layer can be used not only as the wire of low electric resistance but also as the reflecting electrode of high reflectance. Therefore, by using the metal conductive layer both as the wire and as the reflecting electrode, the wire of low electric resistance and the reflecting electrode of high reflectance can be formed at the same time and it is thereby possible to achieve a display device comprising the reflecting electrode of high reflectance without increasing the manufacturing cost.

Furthermore, since the locally exposed portion of the intermediate impurity containing layer serves as the junction, in other words, since the impurity containing layer (intermediate impurity containing layer) needed to form the junction is not locally formed, it is structurally easy to manufacture the device and it is therefore possible to suppress an increase in the manufacturing cost.

BRIEF DESCRIPTION OF DRAWINGS

FIG. 10 (a) is an enlarged view showing the reflecting pixel portion in a region X of FIG. 9, and (b) is an enlarged view showing the junction of the reflecting pixel portion and the transparent pixel portion in a region Y of FIG. 9.

FIG. 16 (a) is an enlarged view showing the reflecting pixel portion in a region X of FIG. 15, and (b) is an enlarged view showing the junction of the reflecting pixel portion and the transparent pixel portion in a region Y of FIG. 15.

FIG. 23 (a) is an enlarged view showing a region X of FIG. 22, and (b) is an enlarged view showing a region Y of FIG. 22.

FIG. 28 (a) is an enlarged view showing the region X of FIG. 22 in the case of a seventh preferred embodiment, and (b) is an enlarged view showing the region Y of FIG. 22 in the case of the seventh preferred embodiment;

FIG. 30 A view showing the respective portions shown in FIG. 28 in the course of the manufacturing process in accordance with an eighth preferred embodiment.

FIG. 31 A view showing the respective portions shown in FIG. 28 in the course of the manufacturing process in accordance with an eighth preferred embodiment.

FIG. 34 A view showing the respective portions shown in FIG. 28 in the course of the manufacturing process in accordance with an eighth preferred embodiment.

FIG. 35 A view showing the respective portions shown in FIG. 28 in the course of the manufacturing process in accordance with an eighth preferred embodiment.

FIG. 38 A view showing the respective portions shown in FIG. 28 in the course of the manufacturing process in accordance with a ninth preferred embodiment.

FIG. 39 A view showing the respective portions shown in FIG. 28 in the course of the manufacturing process in accordance with a ninth preferred embodiment.

FIG. 40 A view showing the respective portions shown in FIG. 28 in the course of the manufacturing process in accordance with a ninth preferred embodiment.

FIG. 41 A view showing the respective portions shown in FIG. 28 in the course of the manufacturing process in accordance with a ninth preferred embodiment.

FIG. 42 A view showing the respective portions shown in FIG. 28 in the course of the manufacturing process in accordance with a ninth preferred embodiment.

FIG. 43 A view showing the respective portions shown in FIG. 28 in the course of the manufacturing process in accordance with a ninth preferred embodiment.

BEST MODE FOR CARRYING OUT THE INVENTION

The First Preferred Embodiment

Figure 1:
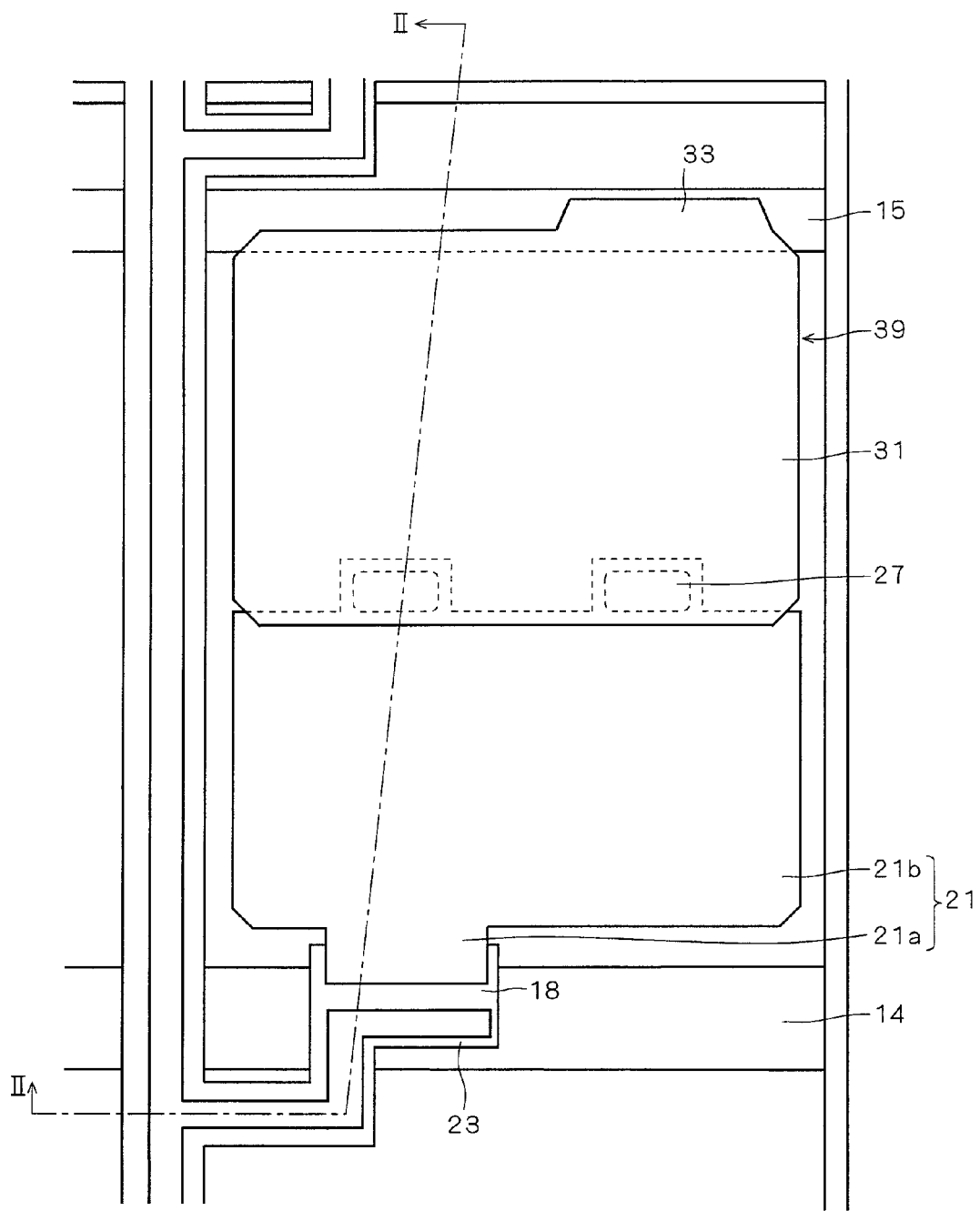
FIG. 1 A plan view showing a display device in accordance with first, third and fifth preferred embodiments of the present invention.
Figure 2:
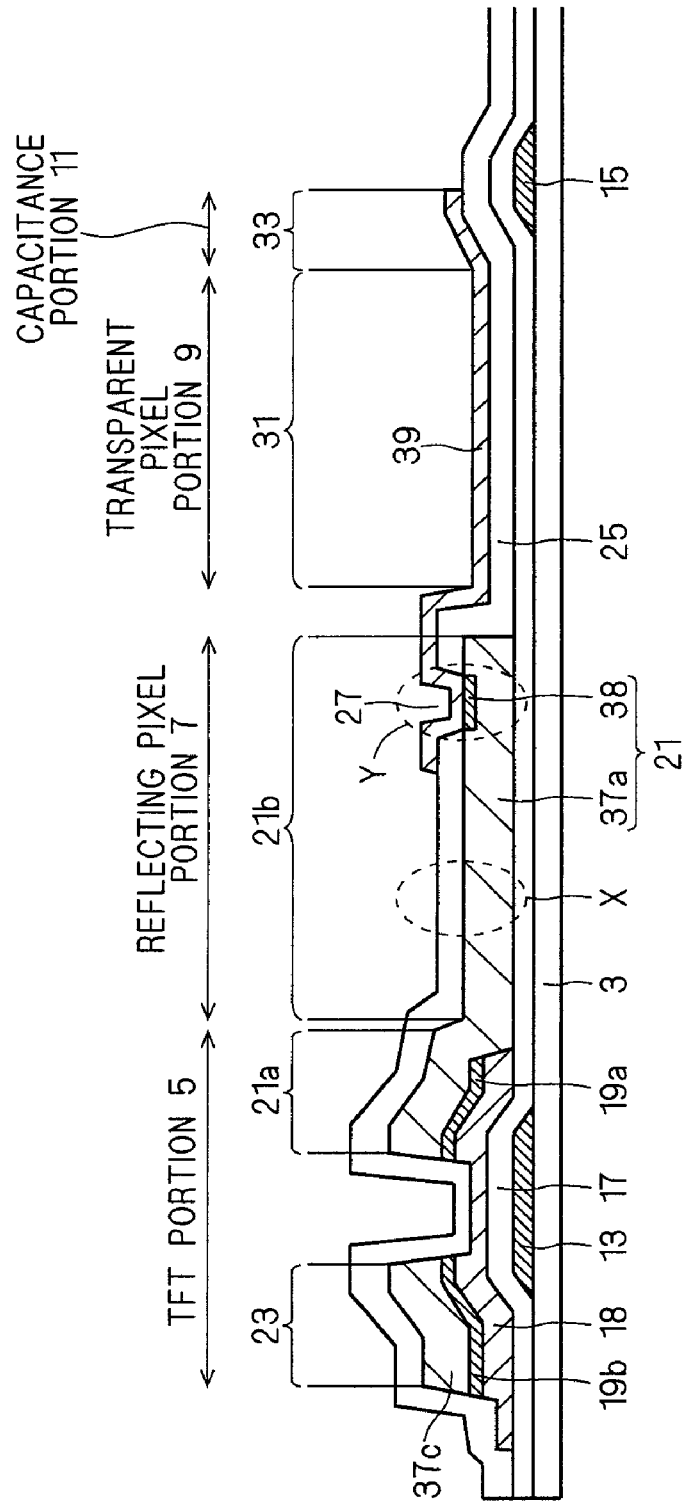
FIG. 2 A cross section taken along the line II-II of FIG. 1 in the case of the first preferred embodiment.

As shown in FIGS. 1 and 2, a pixel portion of a display device 1 of the first preferred embodiment comprises a transparent insulating substrate (substrate) 3 such as a glass substrate, and a thin film transistor portion (hereinafter, referred to as a "TFT portion") 5, a reflecting pixel portion 7 adjacent to the TFT portion 5, a transparent pixel portion 9 adjacent to the reflecting pixel portion 7 and a capacitance portion 11 adjacent to the transparent pixel portion 9 which are formed on the substrate 3.

Discussing in more detail, the display device 1 has the following structure. Specifically, on the substrate 3, a gate electrode 13 a gate wire 14 connected to the gate electrode 13 (see FIG. 1) and a lower auxiliary capacitance electrode 15 are formed and a gate insulating film 17 is so formed on a substantially entire upper surface of the substrate 3 as to cover the above constituent elements.

In a range of forming the TFT portion 5 on an upper surface of the gate electrode 13, a semiconductor active layer 18 made of e.g., an amorphous silicon film is formed through the gate insulating film 17.

On the semiconductor active layer 18, ohmic contact layers 19a and 19b each made of $n^+$ amorphous silicon layer are formed. The ohmic contact layer 19a is so formed as to be overlaid on an end portion of one side of the gate electrode 13 (on the side of the reflecting pixel portion 7) and on the other hand, the ohmic contact layer 19b is so formed as to be overlaid on an end portion of the other side of the gate electrode 13.

On the ohmic contact layer 19b, a source electrode 23 is formed of an aluminum layer 37c made of aluminum or an aluminum alloy.

Further, a drain electrode 21 is formed across a range of forming the reflecting pixel portion 7 on an upper surface of the gate insulating film 17 and an upper surface of the ohmic contact layer 19a.

The drain electrode 21 has an aluminum layer 37a made of aluminum or an aluminum alloy and a local impurity containing layer 38 made of aluminum or an aluminum alloy containing at least one impurity of nitrogen (N), oxygen (O), silicon (Si) and carbon (C). In a surface of the drain electrode 21, a junction with a transparent electrode film 39 described later is locally formed of the local impurity containing layer 38 (in more detail, locally in the direction of surface; the same applies to the following) and the portion other than the junction is formed of the aluminum layer 37a. Discussing in more detail, herein, of the drain electrode 21, only the junction in its surface layer is formed of the local impurity containing layer 38 and the entire remaining portion is formed of the aluminum layer 37a.

Of the drain electrode 21, a portion on the ohmic contact layer 19a serves as a TFT drain electrode 21a and a portion in the range of forming the reflecting pixel portion 7 serves as a reflecting pixel portion electrode 21b. Herein, the junction is formed on a surface of the reflecting pixel portion electrode 21b.

On the substrate 3, an interlayer insulating film 25 is so formed as to cover exposed portions of the constituent elements 17, 18, 19a, 19b, 21 and 23. In the interlayer insulating film 25, a contact hole 27 is so formed as to expose the local impurity containing layer 38 in a surface of the reflecting pixel portion electrode 21b.

On the interlayer insulating film 25, a transparent electrode film 39 is so formed as to cover the contact hole 27, a range of forming the transparent pixel portion 9 and a range of forming a capacitance portion 11. In this state, the transparent electrode film 39 is joined to the local impurity containing layer 38 exposed from the contact hole 27. Further, of the transparent electrode film 39, a portion in the range of forming the transparent pixel portion 9 serves as a transparent pixel portion electrode 31 and a portion in the range of forming the capacitance portion 11 serves as an upper auxiliary capacitance electrode 33.

In the display device 1 having such a structure, the constituent elements 13, 17, 18, 19a, 19b, 23, 21a and 25 in the range of forming the TFT portion 5 constitute the TFT portion 5, and the constituent elements 17, 21b and 25 in the range of forming the reflecting pixel portion 7 constitute the reflecting pixel portion 7. Further, the constituent elements 17, 25 and 31 in the range of forming the transparent pixel portion 9 constitute the transparent pixel portion 9, and the constituent elements 15, 17, 25 and 33 in the range of forming the capacitance portion 11 constitute the capacitance portion 11.

Figure 3:
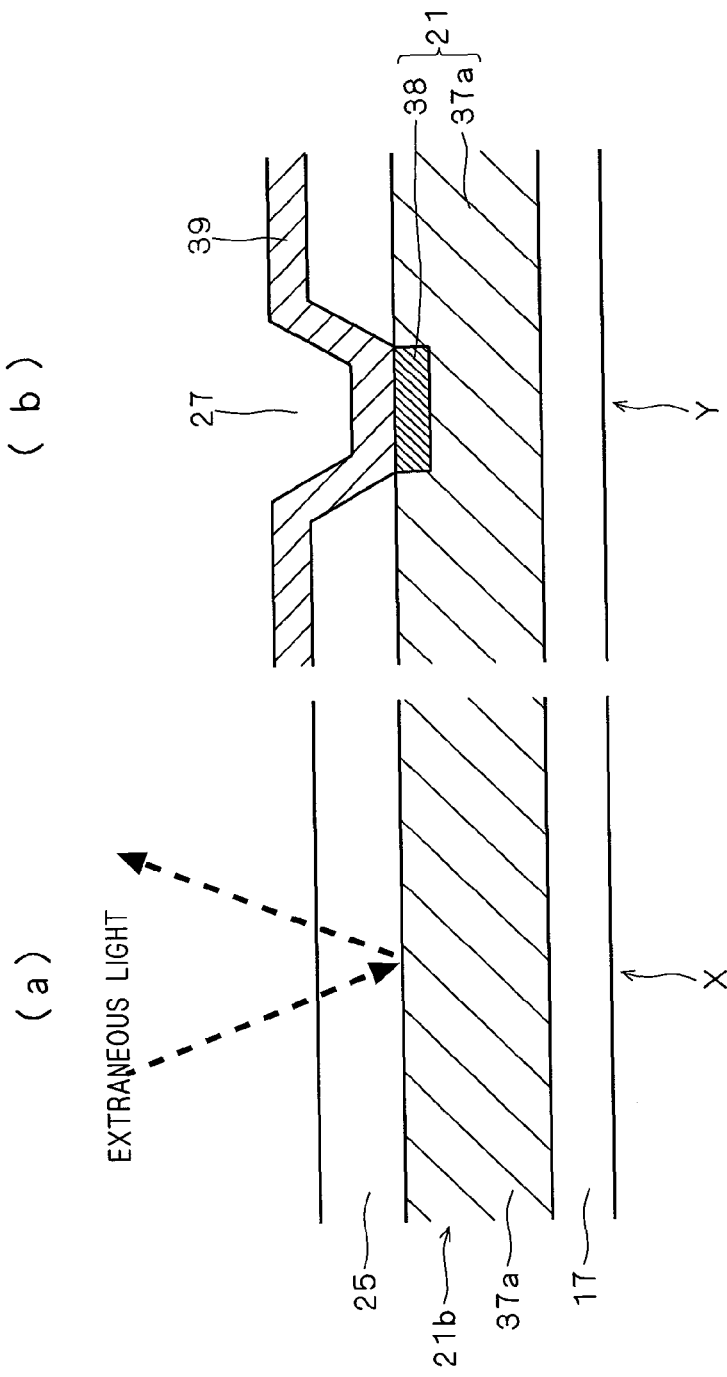
FIG. 3 (a) is an enlarged view showing a reflecting pixel portion in a region X of FIG. 2, and (b) is an enlarged view showing a junction of the reflecting pixel portion and a transparent pixel portion in a region Y of FIG. 2.

Portions (a) and (b) of FIG. 3 are enlarged views showing positions X and Y of FIG. 2, respectively. In this structure, as shown in a portion (b) of FIG. 3, the transparent electrode film 39 and the drain electrode 21 are joined to each other through the local impurity containing layer 38 exposed from the contact hole 27. Therefore, it is possible to suppress formation of an oxide layer in a junction face (interface) of these constituent elements 39 and 21. Further, as shown in a portion (a) of FIG. 3, in the reflecting pixel portion electrode 21b, since the extraneous light is reflected from the aluminum layer 37a not containing any impurity, it is possible to achieve high reflectance.

The film thickness of the source electrode 23 and the drain electrode 21 is usually set to 300 nm to 600 nm and in this case, an appropriate film thickness of the local impurity containing layer 38 is 5 nm to 200 nm. In the case where the local impurity containing layer 38 is formed by introducing nitrogen (N), an appropriate degree of nitriding of the local impurity containing layer 38 is 0.1 to 0.9. The degree of nitriding indicates the concentration of nitrogen in an aluminum nitride layer, and the degree of nitriding is defined as AlN/(AlN+Al).

Herein, the aluminum layers 37a and 37c and the local impurity containing layer 38 (in other words, the drain electrode 21 and the source electrode 23) constitute a metal conductive layer.

In the display device 1 having the above structure, since the metal conductive layer (herein, the drain electrode 21 and the source electrode 23) is formed of the aluminum layers 37a and 37c each made of aluminum or an aluminum alloy, it is possible to achieve a wire of low electric resistance. Then, in a surface of the metal conductive layer, since the junction with a transparent electrode film 39 is locally formed of an impurity containing layer (herein, the local impurity containing layer 38), it is possible to reduce the contact resistance at the junction of the metal conductive layer and the transparent electrode film.

Further, as discussed above, since no aluminum in the wire is removed in joining the metal conductive layer (the wire) and the transparent electrode film 39, unlike the background-art aluminum-removed contact structure, the electric resistance of the wire does not increase and no constraint is given on input/output terminals for connection to array peripheral and external circuits and wiring patterns with retrofitted LSI chips, and it is therefore possible to relatively reduce the layout area.

Since the portion in the surface of the metal conductive layer other than the junction is formed of the aluminum layer 37c made of aluminum or an aluminum alloy, the metal conductive layer can be used not only as a wire of low electric resistance but also as a reflecting electrode of high reflectance. Therefore, by using this metal conductive layer as the wire (herein, the TFT drain electrode 21a and the source electrode 23) and as the reflecting electrode (herein, the reflecting pixel portion electrode 21b), a wire of low electric resistance and a reflecting electrode of high reflectance can be formed at the same time and it is thereby possible to achieve a display device comprising a reflecting electrode of high reflectance without increasing the manufacturing cost.

Further, since the metal conductive layer and the transparent electrode film 39 are isolated from each other by the interlayer insulating film 25 through which the contact hole 27 penetrates and the transparent electrode film 39 is joined to the metal conductive layer only in the local impurity containing layer 38 exposed from the contact hole 27, it is possible to appropriately join the metal conductive layer and the transparent electrode film 39 even if these are joined only in the contact hole 27.

Since the impurity is at least one of nitrogen (N), oxygen (O), silicon (Si) and carbon (C), it is possible to appropriately prevent an oxide film from being formed on a surface of the impurity containing layer.

The Second Preferred Embodiment

A method of manufacturing a display device in accordance with the second preferred embodiment is a method of manufacturing the display device 1 of the above first preferred embodiment. Hereinafter, referring to FIG. 2 and FIGS. 4 to 8, discussion will be made on the method of manufacturing the display device in accordance with the second preferred embodiment.

Figure 4:
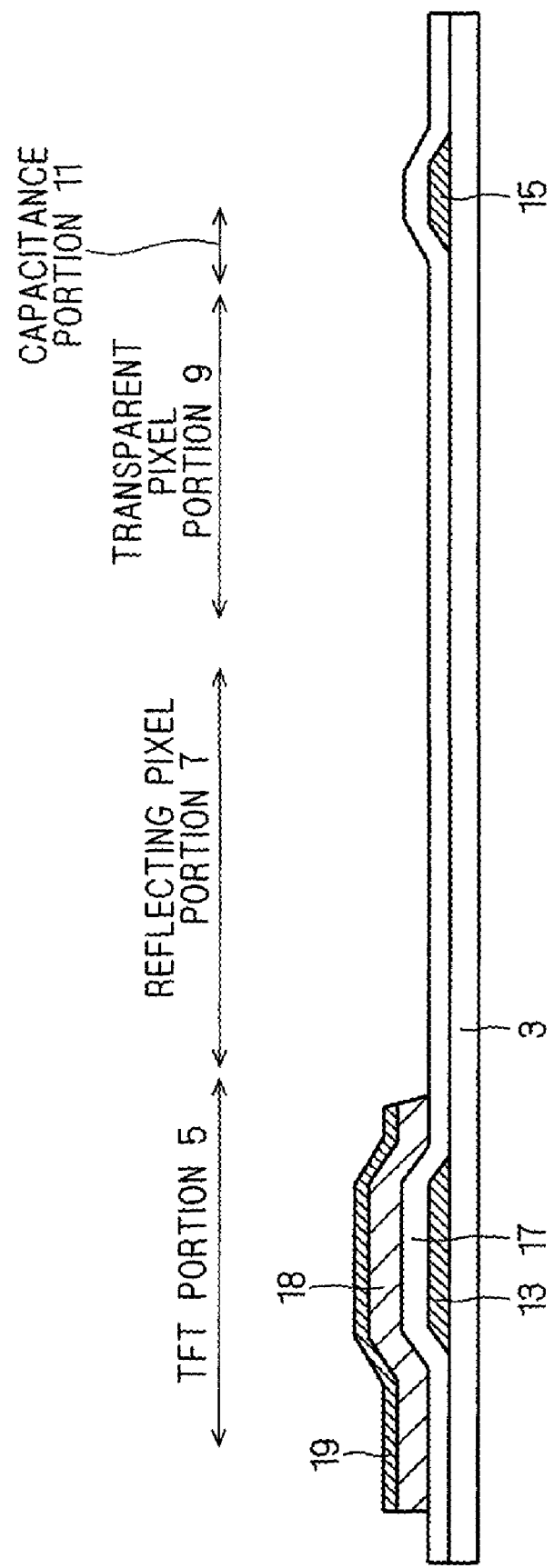
FIG. 4 A view illustrating a process until an ohmic contact layer 19 is formed.

First, as shown in FIG. 4, on the substrate 3, the gate electrode 13, the gate wire 14 connected to the gate electrode 13 (see FIG. 1) and the lower auxiliary capacitance electrode 15 are formed and the gate insulating film 17 is so formed on the substantially entire upper surface of the substrate 3 as to cover these constituent elements. On the gate insulating film 17, the semiconductor active layer 18 and the ohmic contact layer 19 are so layered in this order as to cover the gate electrode 13.

Figure 5:
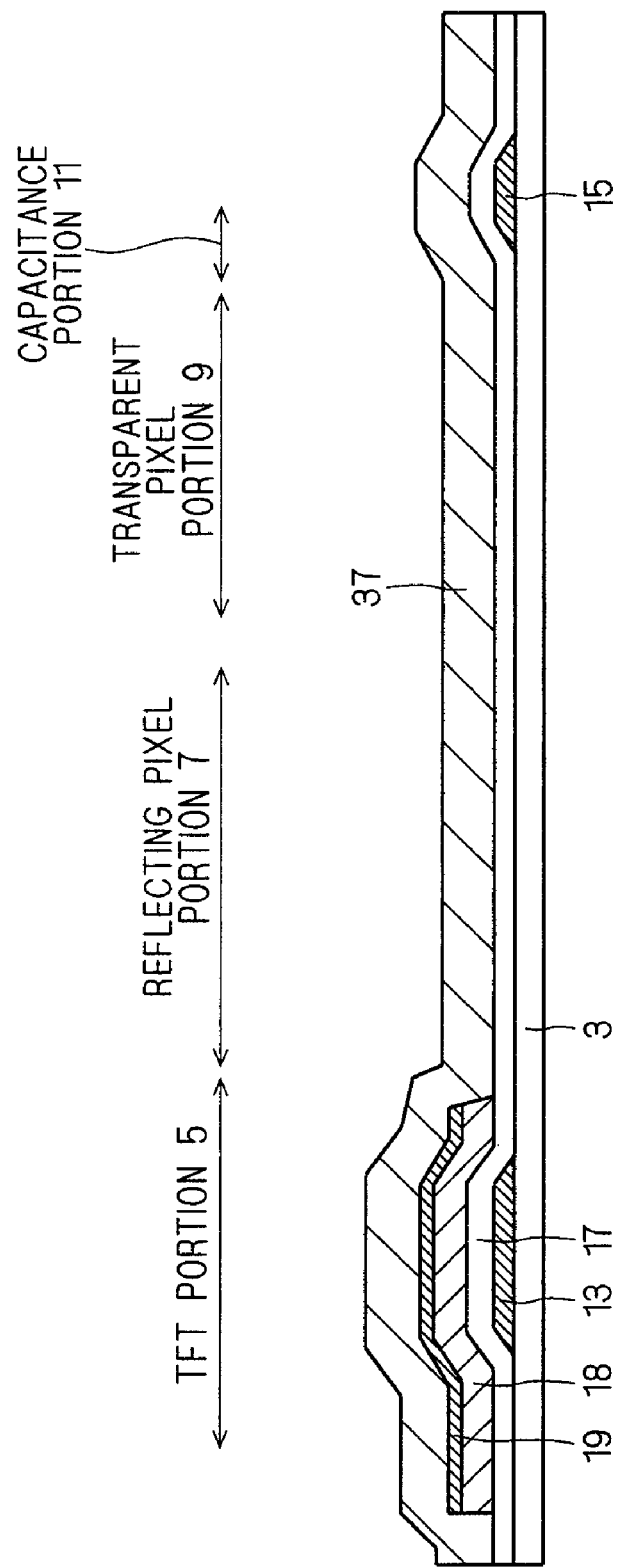
FIG. 5 A view illustrating a process of forming an aluminum layer 37.

As shown in FIG. 5, on the substantially entire upper surface of the substrate 3, the aluminum layer 37 made of aluminum or an aluminum alloy is so layered as to cover the exposed portions of the constituent elements 17, 18 and 19 by sputtering or the like.

Figure 6:
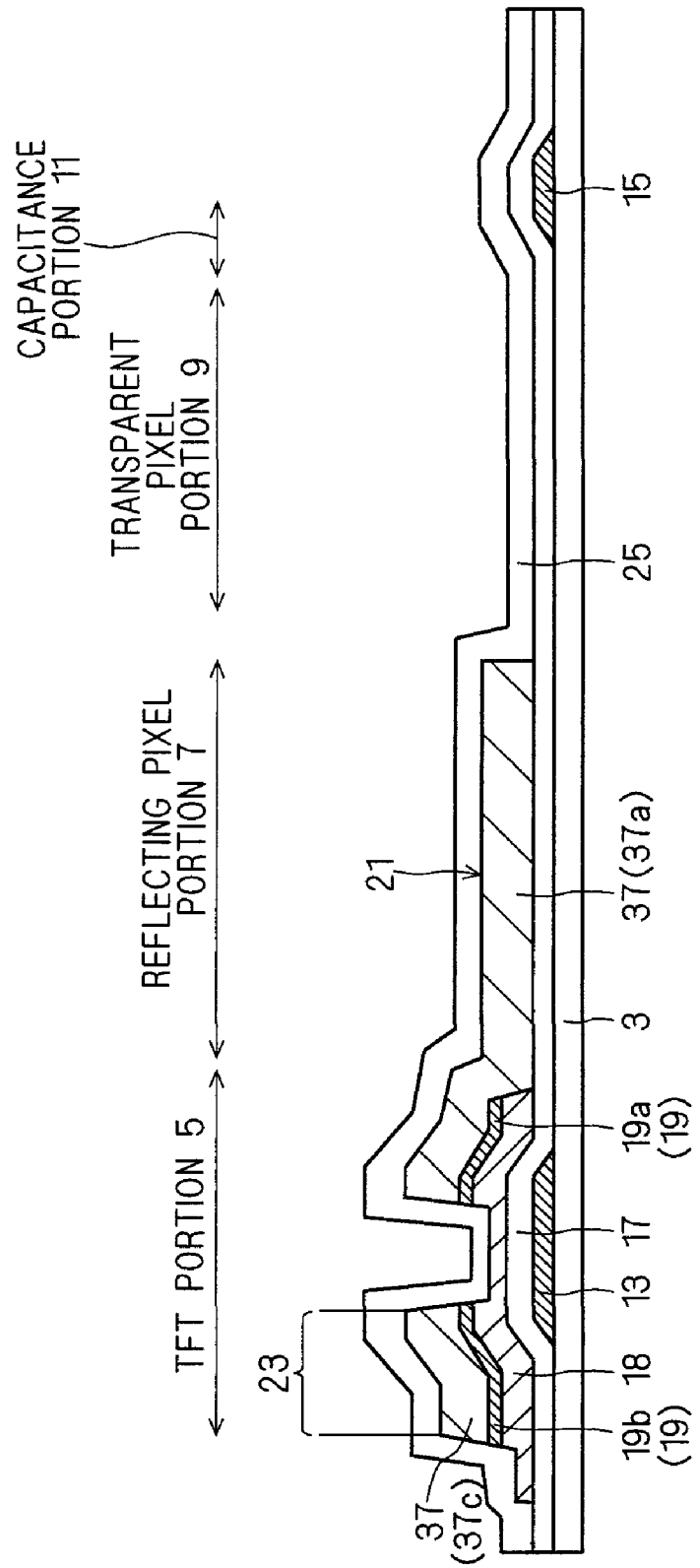
FIG. 6 A view illustrating a process of forming a source electrode 23, a drain electrode 21 and an interlayer insulating film 25.

As shown in FIG. 6, by lithography and etching, an unnecessary portion of the ohmic contact layer 19 (i.e., a portion overlapping the center portion of the gate electrode 13) and an unnecessary portion of the aluminum layer 37 (i.e., a portion overlapping the center portion of the gate electrode 13 and a portion other than the ranges of forming the constituent elements 5, 7 and 9) are removed.

With this removal, a TFT structure (a recess in the center portion of the gate electrode 13) is formed and the source electrode 23 and the drain electrode 21 (in more detail, a portion of the drain electrode 21 other than the junction discussed later) are formed (in other words, a wire portion (the source electrode 23 and the TFT drain electrode 21a portion of the drain electrode 21) and a reflecting electrode portion (the reflecting pixel portion electrode 21b portion of the drain electrode 21)) of the aluminum layer 37.

Further, a portion of the ohmic contact layer 19 on the side of the reflecting pixel portion 7 serves as the ohmic contact layer 19a and a portion thereof on the other side serves as the ohmic contact layer 19b. A portion 37c of the aluminum layer 37 formed on the ohmic contact layer 19b serves as the source electrode 23 and a portion 37a thereof formed on the ohmic contact layer 19a and in the range of forming the reflecting pixel portion 7 serves as the drain electrode 21 (in more detail, a portion of the drain electrode 21 other than the junction discussed later).

As shown in FIG. 6, on the substrate 3, the interlayer insulating film 25 is so formed as to cover the exposed portions of the constituent elements 17, 18, 19a, 19b, 37a and 37c.

Figure 7:
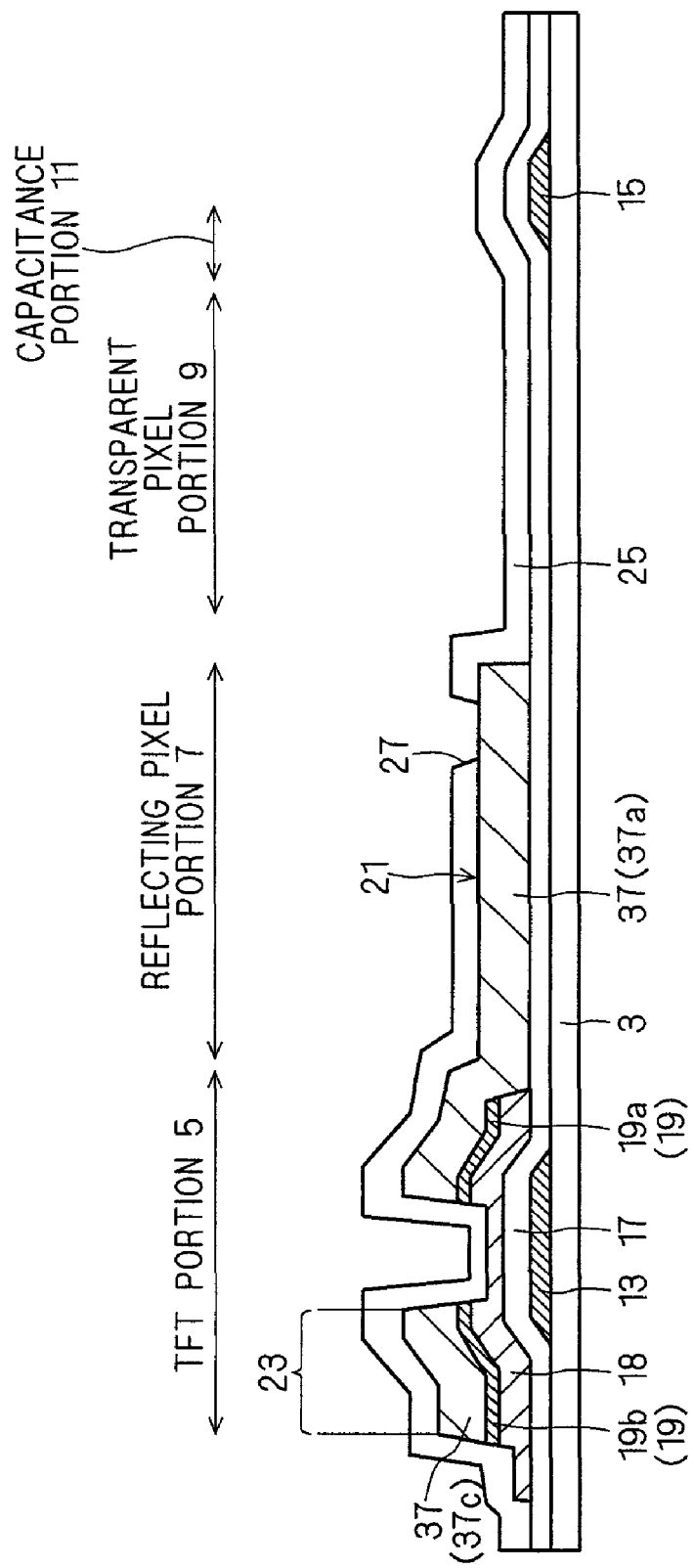
FIG. 7 A view illustrating a process of forming a contact hole 27.

As shown in FIG. 7, by lithography and etching, in e.g., the range of forming the reflecting pixel portion 7, the contact hole 27 is so formed in the interlayer insulating film 25 as to expose the aluminum layer 37a therebelow. In the case where the interlayer insulating film 25 is a silicon nitride (SiN) film, generally, dry etching is performed by using a fluorine-containing gas as an etching gas. In this case, only the interlayer insulating film 25 is mainly etched and almost no aluminum layer 37a is etched.

Figure 8:
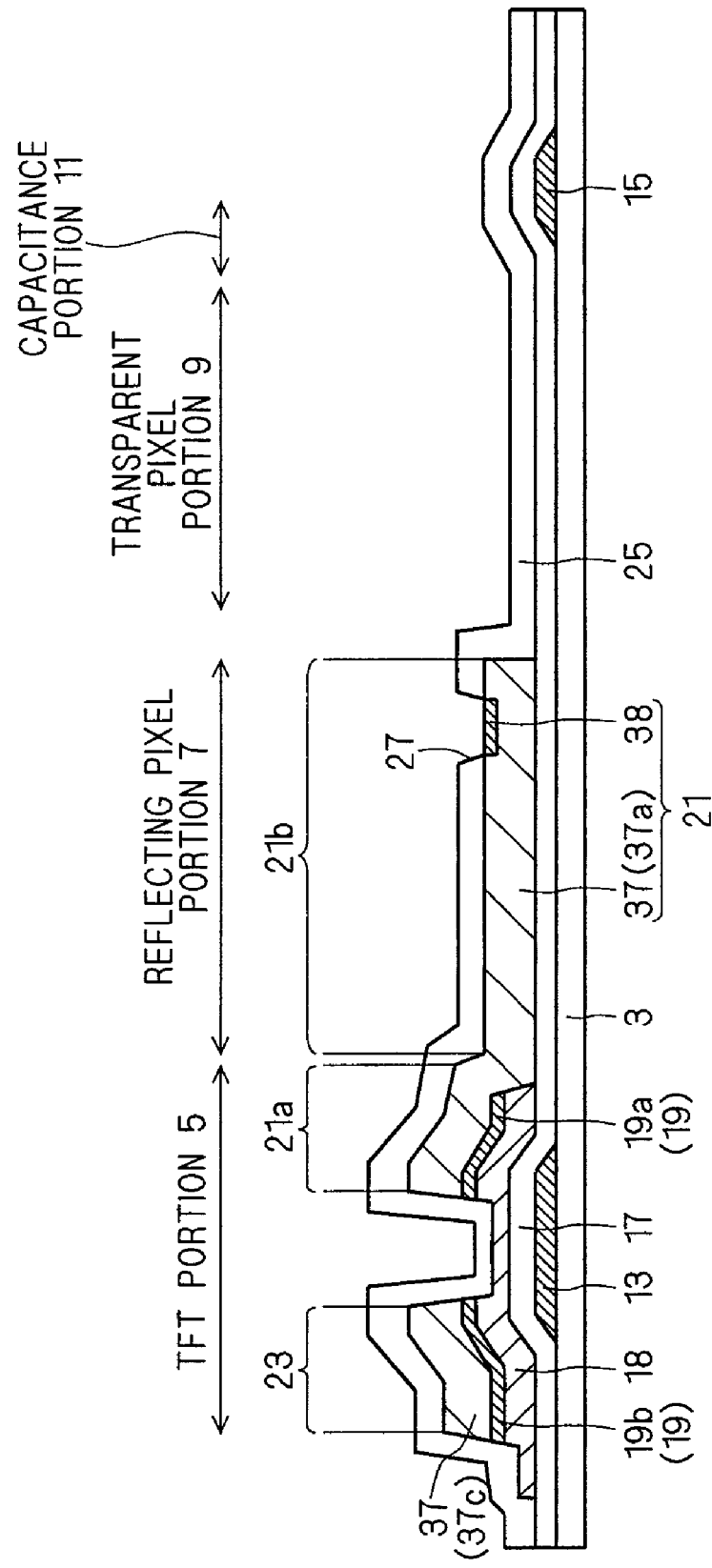
FIG. 8 A view illustrating a process of forming a local impurity containing layer 38.

As shown in FIG. 8, by ion implantation or plasma surface treatment, at least one impurity of nitrogen (N), oxygen (O), silicon (Si) and carbon (C) is implanted into a surface layer of the portion of the aluminum layer 37a exposed from the contact hole 27, to thereby locally form the local impurity containing layer 38 in the surface layer of the aluminum layer 37. This local impurity containing layer 38 serves as the junction with the transparent electrode film 39 discussed later.

At that time, if nitrogen (N) is introduced by ion implantation to form the local impurity containing layer 38, in order to achieve a thickness of 5 nm, the implantation energy is e.g., about 1 to 10 KeV, and in order to achieve a thickness of 200 nm, the implantation energy is e.g., about 70 to 900 KeV.

The aluminum layer 37a and the local impurity containing layer (junction) 38 constitute the drain electrode 21. A portion of the drain electrode 21 on the ohmic contact layer 19a serves as the TFT drain electrode 21a and a portion thereof in the range of forming the reflecting pixel portion 7 serves as the reflecting pixel portion electrode 21b. The aluminum layers 37a and 37c and the local impurity containing layer 38 (in other words, the drain electrode 21 and the source electrode 23) constitute the metal conductive layer.

On the interlayer insulating film 25, as shown in FIG. 2, the transparent electrode film 39 is so formed as one unit as to cover the entire range of forming the transparent pixel portion 9, the contact hole 27 and the lower auxiliary capacitance electrode 15. In this state, the transparent electrode film 39 is joined to the local impurity containing layer 38 exposed from the contact hole 27.

In the method of manufacturing the display device having the above structure, since the wire portion (herein, the source electrode 23 and the TFT drain electrode 21a) and the reflecting electrode portion (the reflecting pixel portion electrode 21b) are formed at the same time, there is no need to add another step of forming the reflecting electrode portion, and it is therefore possible to achieve a display device comprising the reflecting electrode of high reflectance without increasing the manufacturing cost.

The Third Preferred Embodiment

A display device 1B of the third preferred embodiment has the same structure as the display device 1 of the above first preferred embodiment except the structure of the wire portion (the source electrode 23 and the TFT drain electrode 21a) and the reflecting electrode portion (the reflecting pixel portion electrode 21b). Hereinafter, the constituent elements of the display device 1B of the third preferred embodiment which are identical to those of the display device 1 of the first preferred embodiment are represented by the same reference signs and discussion thereof will be omitted, and only difference will be discussed.

Figure 9:
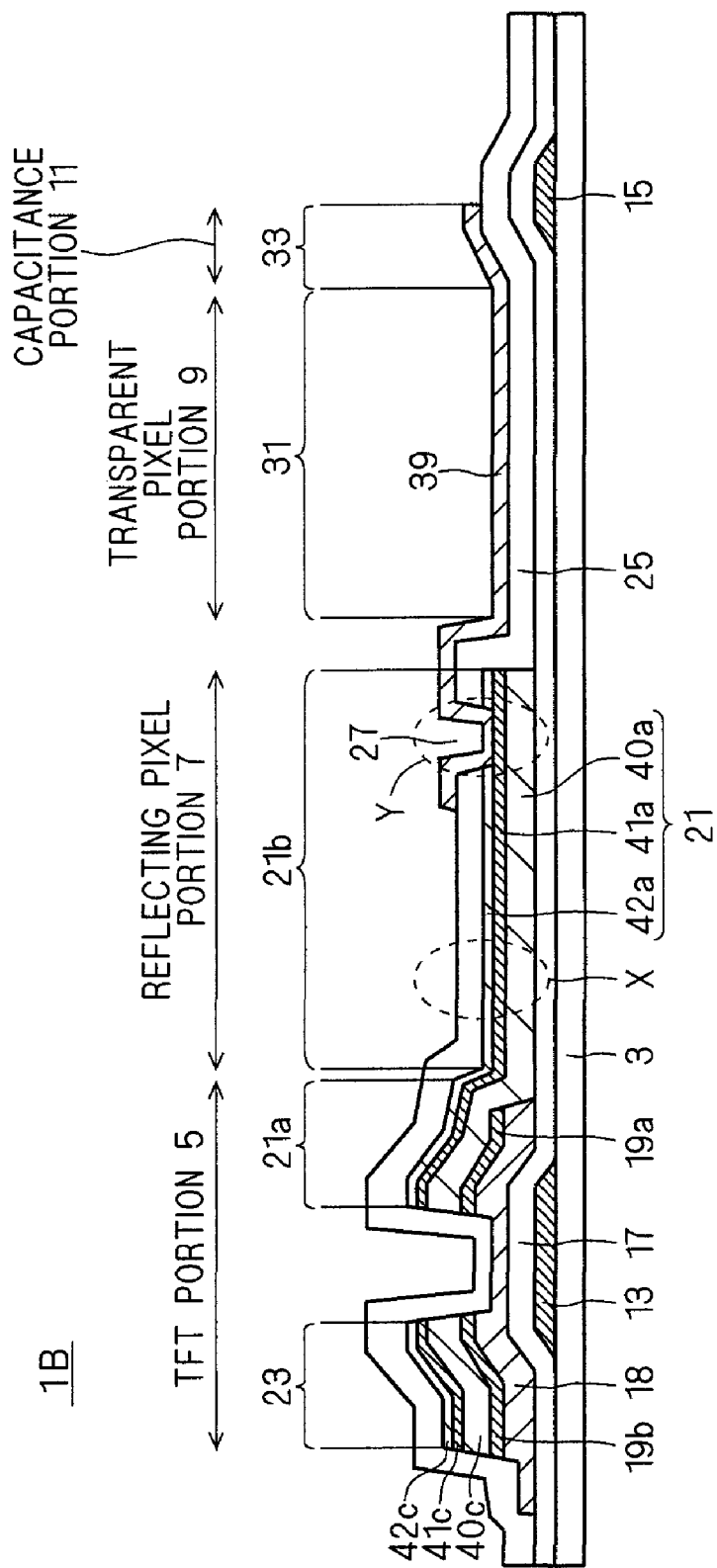
FIG. 9 A cross section taken along the line II-II of FIG. 1 in the case of the third preferred embodiment.

In the third preferred embodiment, as shown in FIG. 9, the drain electrode 21 and the source electrode 23 are constituted of lower aluminum layers 40a and 40c each made of aluminum or an aluminum alloy, intermediate impurity containing layers (impurity containing layers) 41a and 41c each made of aluminum or an aluminum alloy containing at least one impurity of nitrogen (N), oxygen (O), silicon (Si) and carbon (C), which are layered on substantially entire upper surfaces of the lower aluminum layers 40a and 40c, and upper aluminum layers 42a and 42c each made of aluminum or an aluminum alloy, which are layered on substantially entire upper surfaces of the intermediate impurity containing layers 41a and 41c, respectively.

On the substrate 3, the interlayer insulating film 25 is so formed as to cover the exposed portions of the constituent elements 17, 18, 19a, 19b, 21 and 23. The contact hole 27 is so formed as to penetrate through the interlayer insulating film 25 and the upper aluminum layer 42a and locally expose the intermediate impurity containing layer 41a. The above locally exposed portion of the intermediate impurity containing layer 41a serves as the junction with the transparent electrode film 39 discussed later. Specifically, on the surface of the drain electrode 21, the junction is locally formed of the exposed portion of the intermediate impurity containing layer (impurity containing layer) 41a and the portion other than the junction is formed of the upper aluminum layer (aluminum layer) 42a.

On the interlayer insulating film 25, the transparent electrode film 39 is so formed as to cover the range of forming the transparent pixel portion 9 and the range of forming the capacitance portion 11. In this state, the transparent electrode film 39 is joined to the intermediate impurity containing layer 41a exposed from the contact hole 27.

In this structure, as shown in a portion (b) of FIG. 10, the transparent electrode film 39 and the drain electrode 21 are joined to each other through the intermediate impurity containing layer 41a exposed from the contact hole 27. Therefore, it is possible to suppress formation of an oxide layer at the junction of these constituent elements 39 and 21. Further, as shown in a portion (a) of FIG. 10, in the reflecting pixel portion electrode 21b, since the extraneous light is reflected from the upper aluminum layer 42a not containing any impurity, it is possible to achieve high reflectance.

The film thickness of the source electrode 23 and the drain electrode 21 is usually set to 300 nm to 600 nm and in this case, an appropriate film thickness of the intermediate impurity containing layers 41a and 41c is 5 nm to 200 nm. In the case where the intermediate impurity containing layers 41a and 41c are formed by introducing nitrogen (N), an appropriate degree of nitriding of the intermediate impurity containing layers 41a and 41c are 0.1 to 0.9. Further, an appropriate film thickness of the upper aluminum layers 42a and 42c is 5 nm or more.

Herein, the aluminum layers 40a, 40c, 42a and 42c and the intermediate impurity containing layers 41a and 41c constitute the metal conductive layer.

The display device 1B having the above structure also produces the same effect as that of the display device 1 of the above first preferred embodiment.

Further, since the metal conductive layer (e.g., the drain electrode 21) has the lower aluminum layer 40a, the intermediate impurity containing layer 41a formed on the substantially entire upper surface of the lower aluminum layer 40a and the upper aluminum layer 42a which is so formed on the intermediate impurity containing layer 41a as to locally expose the intermediate impurity containing layer 41a and the above locally exposed portion of the intermediate impurity containing layer 41a serves as the junction, in other words, since the impurity containing layer (herein, the intermediate impurity containing layer 41a) needed to form the junction is not locally formed, unlike the local impurity containing layer 38 of the above-discussed first preferred embodiment, it is structurally easy to manufacture the device and it is therefore possible to suppress an increase in the manufacturing cost.

The Fourth Preferred Embodiment

A method of manufacturing a display device in accordance with the fourth preferred embodiment is a method of manufacturing the display device 1B of the above third preferred embodiment. Hereinafter, referring to FIG. 9 and FIGS. 11 to 14, discussion will be made on the method of manufacturing the display device in accordance with the fourth preferred embodiment.

Figure 11:
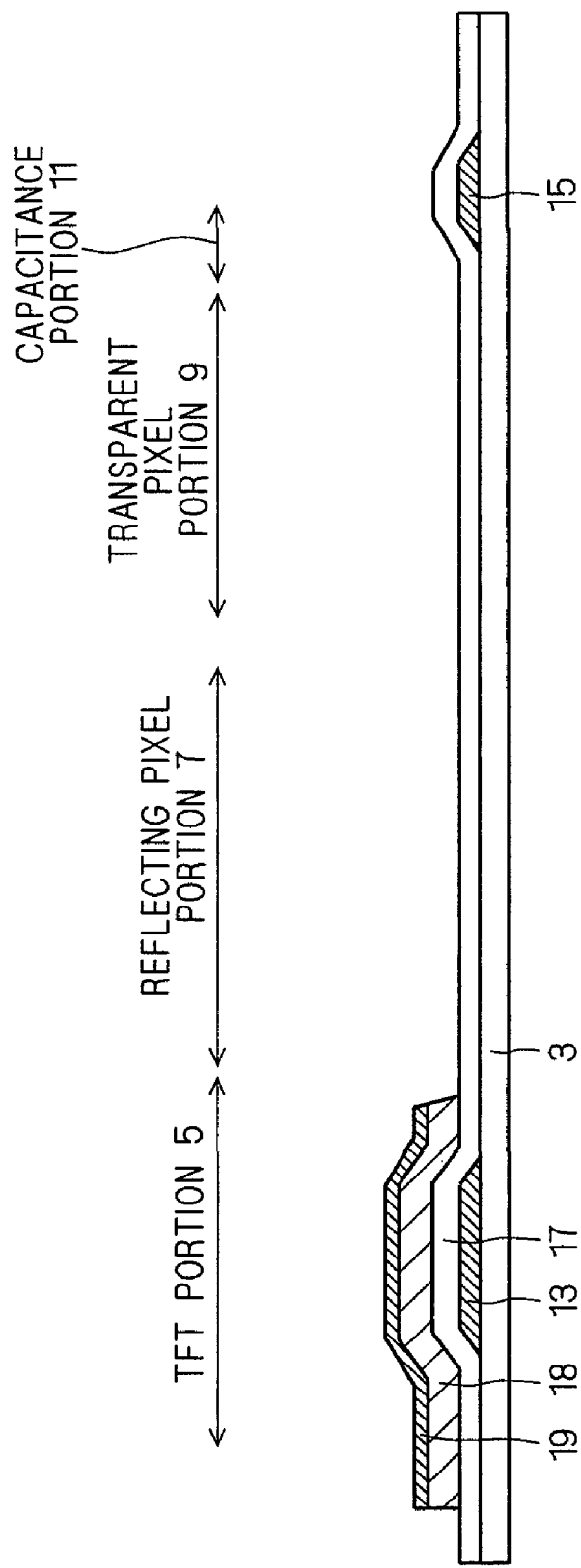
FIG. 11 A view illustrating a process until the ohmic contact layer 19 is formed.

First, as shown in FIG. 11, on the transparent insulating substrate (substrate) 3, the gate electrode 13, the gate wire 14 connected to the gate electrode 13 (see FIG. 1) and the lower auxiliary capacitance electrode 15 are formed and the gate insulating film 17 is so formed on the substantially entire upper surface of the substrate 3 as to cover these constituent elements. On the gate insulating film 17, the semiconductor active layer 18 and the ohmic contact layer 19 are so layered in this order as to cover the gate electrode 13.

Figure 12:
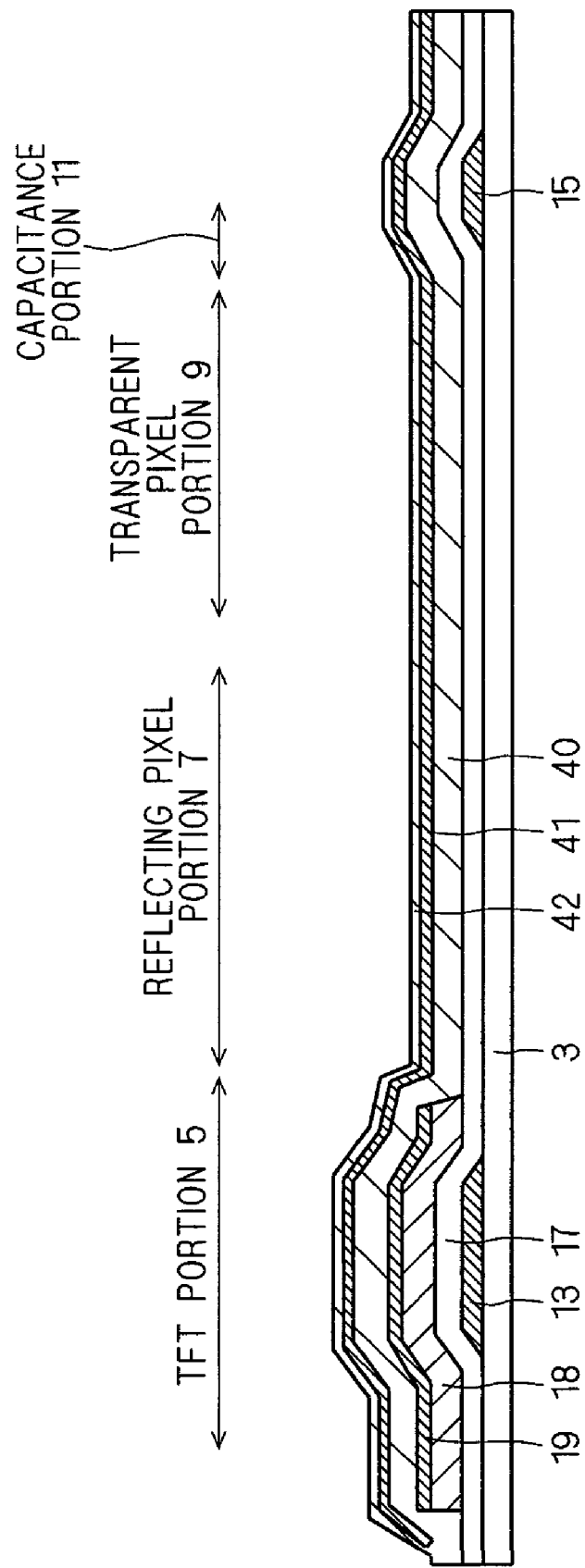
FIG. 12 A view illustrating a process of forming a lower aluminum layer 40, an intermediate impurity containing layer 41 and an upper aluminum layer 42.

As shown in FIG. 12, on the substrate 3, the lower aluminum layer 40 made of aluminum or an aluminum alloy, the intermediate impurity containing layer 41 made of aluminum or an aluminum alloy containing at least one impurity of nitrogen (N), oxygen (O), silicon (Si) and carbon (C) and the upper aluminum layer 42 made of aluminum or an aluminum alloy are so layered in this order as to cover the exposed portions of the constituent elements 17, 18 and 19 by sputtering or the like.

In the case where the lower aluminum layer 40, the intermediate impurity containing layer 41 and the upper aluminum layer 42 are layered by DC magnetron sputtering using the aluminum or the aluminum alloy as a target, the lower aluminum layer 40 is first layered by using pure argon (Ar) gas as a sputtering gas. Next, the intermediate impurity containing layer 41 is layered by switching the sputtering gas to a mixed gas of pure argon (Ar) gas and nitrogen ($N_2$) gas. Then, the upper aluminum layer 42 is layered by using pure argon (Ar) gas as the sputtering gas again. In this method, there is no need to use an ion implantation device or a plasma surface treatment device and it is possible to form the intermediate impurity containing layer 41 only by switching the sputtering gas in a sputtering device, as compared with the case of the second preferred embodiment.

Further, if the ion implantation is used, in order to form the local impurity containing layer 38 having a film thickness of 200 nm, a relatively high implantation energy of about 70 to 90 KeV is needed in the above second preferred embodiment. In the case where the intermediate impurity containing layer 41 is formed in accordance with the fourth preferred embodiment, however, since the impurity is introduced in forming the intermediate impurity containing layer 41, it is possible to set the film thickness of the intermediate impurity containing layer 41 thick with a relatively low energy.

Figure 13:
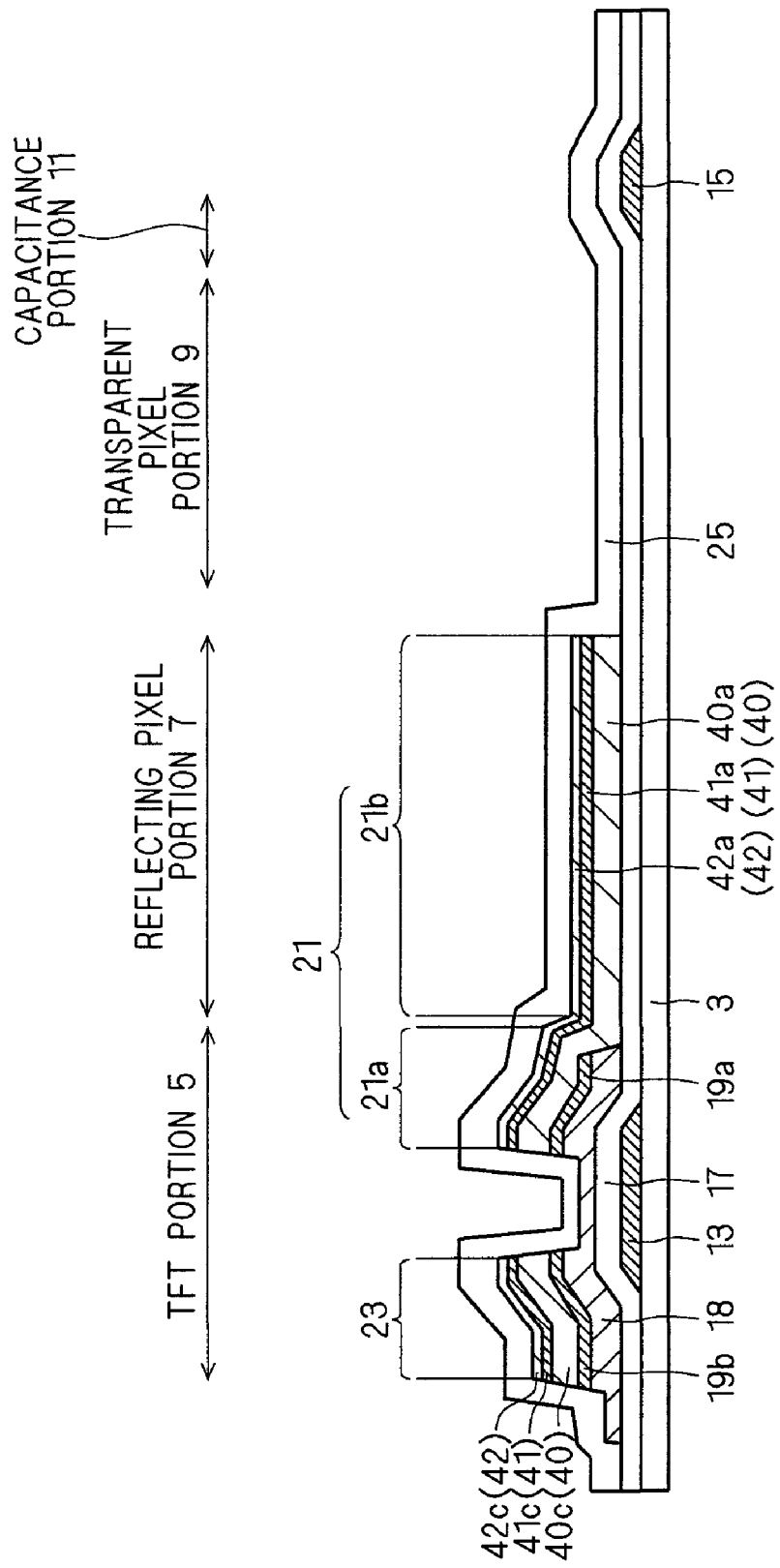
FIG. 13 A view illustrating a process of forming the source electrode 23, the drain electrode 21 and the interlayer insulating film 25.

As shown in FIG. 13, by lithography and etching, the unnecessary portion of the ohmic contact layer 19 (i.e., the portion overlapping the center portion of the gate electrode 13) and an unnecessary portion of the layered body consisting of the constituent elements 40, 41 and 42 (i.e., the portion overlapping the center portion of the gate electrode 13 and a portion other than the ranges of forming the constituent elements 5, 7 and 9) are removed.

With this removal, the TFT structure (the recess in the center portion of the gate electrode 13) is formed and the source electrode 23 and the drain electrode 21 (in more detail, the portion of the drain electrode 21 other than the junction discussed later) are formed (in other words, the wire portion (the source electrode 23 and the TFT drain electrode 21a portion of the drain electrode 21) and the reflecting electrode portion (the reflecting pixel portion electrode 21b portion of the drain electrode 21)) of the layered body.

Further, since the portion of the ohmic contact layer 19 on the side of the reflecting pixel portion 7 serves as the ohmic contact layer 19a and the portion thereof on the other side serves as the ohmic contact layer 19b. A portion of the layered body consisting of the constituent elements 40, 41 and 42 formed on the ohmic contact layer 19b (i.e., the layered body consisting of the constituent elements 40c, 41c and 42c) serves as the source electrode 23 and a portion thereof formed on the ohmic contact layer 19a and in the range of forming the reflecting pixel portion 7 (i.e., the layered body consisting of the constituent elements 40a, 41a and 42a) serves as the drain electrode 21. The portion of the drain electrode 21 on the ohmic contact layer 19a serves as the TFT drain electrode 21a and the portion thereof in the range of forming the reflecting pixel portion 7 serves as the reflecting pixel portion electrode 21b.

As shown in FIG. 13, on the substrate 3, the interlayer insulating film 25 is so formed as to cover the exposed portions of the constituent elements 17, 18, 19a, 19b, 21 and 23.

Figure 14:
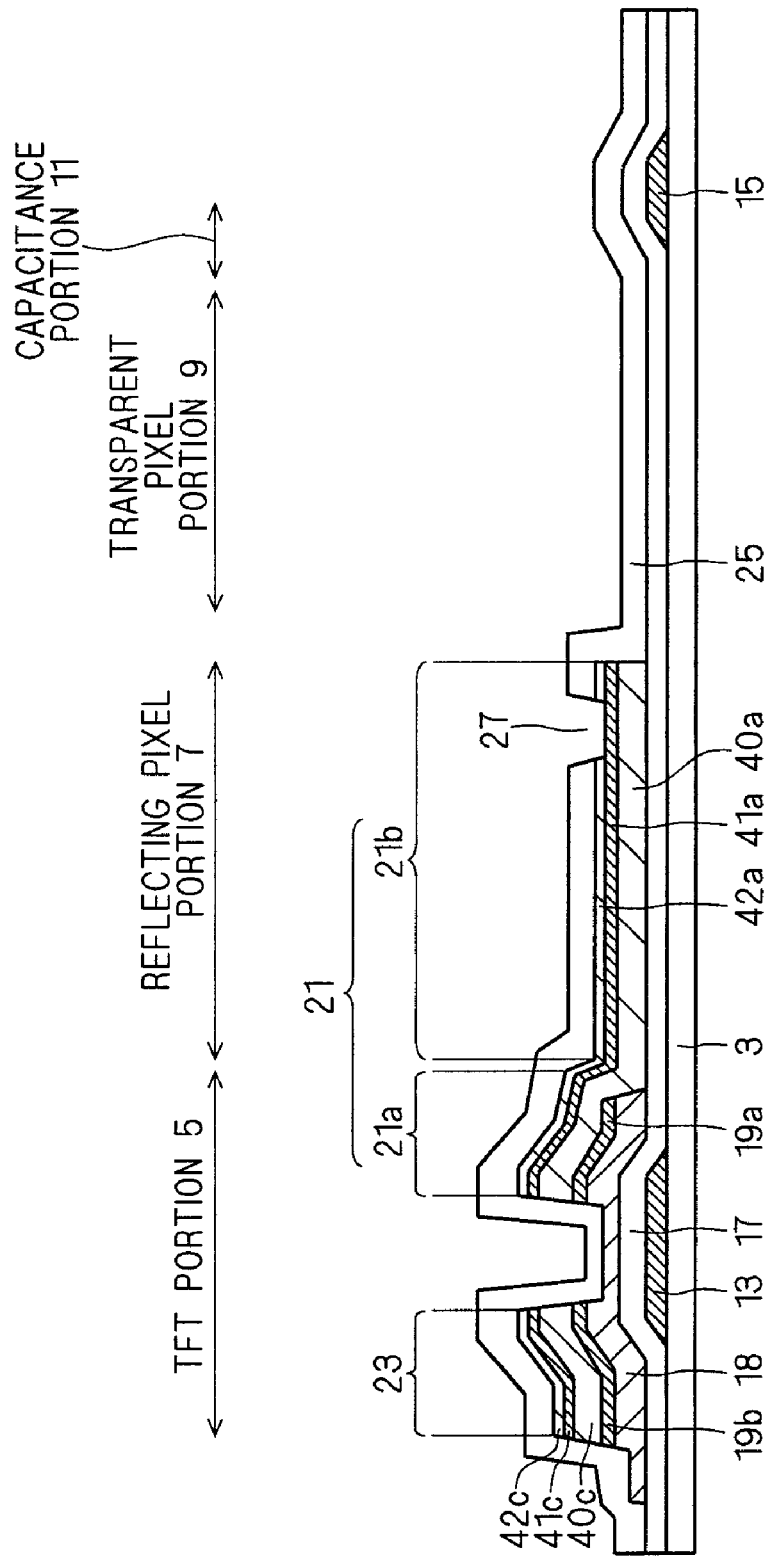
FIG. 14 A view illustrating a process of forming the contact hole 27.

As shown in FIG. 14, by lithography and etching, in e.g., the range of forming the reflecting pixel portion 7, the contact hole 27 is so formed as to penetrate through the interlayer insulating film 25 and the upper aluminum layer 42 and locally expose the intermediate impurity containing layer 41. In more detail, first, a through hole is formed by dry etching, penetrating through the interlayer insulating film 25, to expose the upper aluminum layer 42. Further, the exposed portion of the upper aluminum layer 42 is dissolved by wet etching using an acid solution to expose the intermediate impurity containing layer 41, to thereby form the contact hole 27. At that time, since it is easy to ensure a difference in etching rate between the aluminum alloy layer (or the aluminum layer) and the impurity containing layer by controlling the concentration of the acid solution, it is possible to remove the upper aluminum layer 42 almost without dissolving the impurity containing layer 41. After that, the portion of the intermediate impurity containing layer 41 which is exposed from the contact hole 27 serves as the junction with the transparent electrode film 39 discussed later.

On the interlayer insulating film 25, as shown in FIG. 9, the transparent electrode film 39 is so formed as one unit as to cover the entire range of forming the transparent pixel portion 9, the contact hole 27 and the lower auxiliary capacitance electrode 15. In this state, the transparent electrode film 39 is joined to the portion of the intermediate impurity containing layer 41 exposed from the contact hole 27.

In the method of manufacturing the display device having the above structure, since the wire portion (the source electrode 23 and the TFT drain electrode 21a) and the reflecting electrode portion (the reflecting pixel portion electrode 21b) are formed at the same time, there is no need to add another step of forming the reflecting electrode portion, and it is therefore possible to achieve a display device comprising the reflecting electrode of high reflectance without increasing the manufacturing cost.

Since the intermediate impurity containing layer 41a is layered on the substantially entire upper surface of the lower aluminum layer 40a and then the upper aluminum layer 42a is so layered as to locally expose the intermediate impurity containing layer 41a, to thereby use the locally exposed portion of the intermediate impurity containing layer 41a to locally form the junction with transparent electrode film 39, in other words, since the impurity containing layer (herein, the intermediate impurity containing layer 41a) needed to form the junction is not locally formed, unlike the local impurity containing layer 38 of the above-discussed first preferred embodiment, the intermediate impurity containing layer 41a can be formed, without using the ion implantation device or the plasma surface treatment device, only by using the sputtering device and switching the sputtering gas, and it is therefore possible to suppress an increase in the manufacturing cost.

The Fifth Preferred Embodiment

A display device 1D of the fifth preferred embodiment has the same structure as the display device 1B of the above third preferred embodiment except the structure of the wire portion (the source electrode 23 and the TFT drain electrode 21a) and the reflecting electrode portion (the reflecting pixel portion electrode 21b). Hereinafter, referring to FIGS. 22 and 23, the constituent elements of the display device 1D of the fifth preferred embodiment which are identical to those of the display device 1B of the third preferred embodiment are represented by the same reference signs and discussion thereof will be omitted, and only difference will be discussed.

Figure 22:
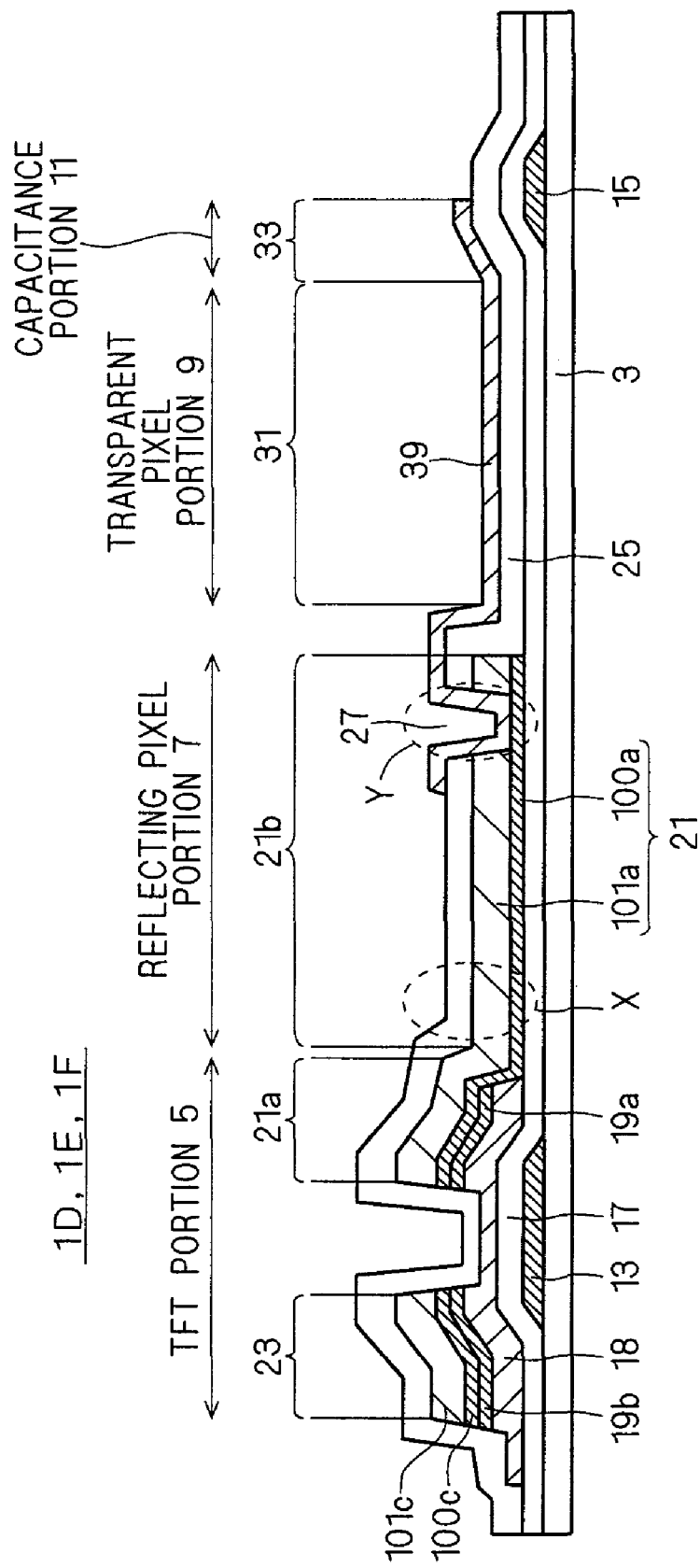
FIG. 22 A cross section taken along the line II-II of FIG. 1 in the case of fifth to tenth preferred embodiments.

In the fifth preferred embodiment, as shown in FIG. 22, the drain electrode 21 and the source electrode 23 are constituted of lower impurity containing layers (impurity containing layers) 100a and 100c each made of aluminum or an aluminum alloy containing at least one impurity of nitrogen (N), oxygen (O), silicon (Si) and carbon (C) and upper aluminum layers 101a and 101c each made of aluminum or an aluminum alloy, respectively.

On the substrate 3, the interlayer insulating film 25 is so formed as to cover the exposed portions of the constituent elements 17, 18, 19a, 19b, 21 and 23. The contact hole 27 is so formed as to penetrate through the interlayer insulating film 25 and the upper aluminum layer 101a and locally expose the lower impurity containing layer 100a. The above locally exposed portion of the lower impurity containing layer 100a serves as the junction with the transparent electrode film 39. Specifically, on the surface of the drain electrode 21, the junction is locally formed of the exposed portion of the lower impurity containing layer (impurity containing layer) 100a and the portion other than the junction is formed of the upper aluminum layer (aluminum layer) 101a.

On the interlayer insulating film 25, the transparent electrode film 39 is so formed as to cover the range of forming the transparent pixel portion 9 and the range of forming the capacitance portion 11. In this state, the transparent electrode film 39 is joined to the lower impurity containing layer 100a exposed from the contact hole 27.

In this structure, as shown in a portion (b) of FIG. 23, the transparent electrode film 39 and the drain electrode 21 are joined to each other through the lower impurity containing layer 100a exposed from the contact hole 27. Therefore, it is possible to suppress formation of an oxide layer at the junction of these constituent elements 39 and 21. Further, as shown in a portion (a) of FIG. 23, in the reflecting pixel portion electrode 21b, since the extraneous light is reflected from the upper aluminum layer 101a not containing any impurity, it is possible to achieve high reflectance.

The film thickness of the source electrode 23 and the drain electrode 21 is usually set to 300 nm to 600 nm and in this case, an appropriate film thickness of the lower impurity containing layers 100a and 100c is 5 nm to 200 nm.

Herein, the upper aluminum layers 101a and 101c and the lower impurity containing layers 100a and 100c constitute the metal conductive layer.

The display device 1D having the above structure also produces the same effect as that of the display device 1 of the above first preferred embodiment.

Further, the lower impurity containing layers 100a and 100c are joined to the ohmic contact layers 19a and 19b, respectively. Specifically, since there is no an aluminum layer or an aluminum alloy layer between the lower impurity containing layer 100a and the ohmic contact layer 19a or between the lower impurity containing layer 100c and the ohmic contact layer 19b, the lower impurity containing layers 100a and 100c are expected to establish an excellent contact with the ohmic contact layers 19a and 19h, respectively.

The Sixth Preferred Embodiment

A method of manufacturing a display device in accordance with the sixth preferred embodiment is a method of manufacturing the display device 1D of the above fifth preferred embodiment. Hereinafter, referring to FIG. 22 and FIGS. 24 to 27, discussion will be made on the method of manufacturing the display device in accordance with the sixth preferred embodiment.

Figure 24:
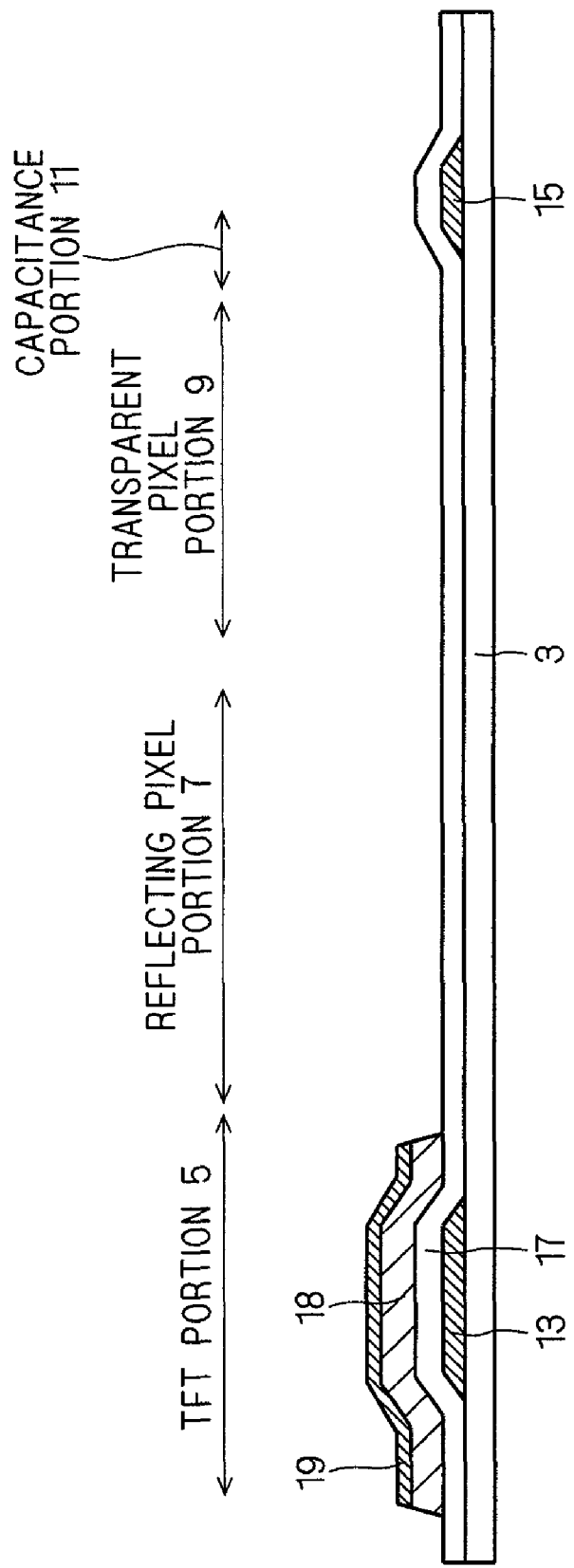
FIG. 24 A cross section taken along the line II-II in the course of the manufacturing process in accordance with a sixth preferred embodiment.

First, as shown in FIG. 24, on the transparent insulating substrate (substrate) 3, the gate electrode 13, the gate wire 14 connected to the gate electrode 13 (see FIG. 1) and the lower auxiliary capacitance electrode 15 are formed and the gate insulating film 17 is so formed on the substantially entire upper surface of the substrate 3 as to cover these constituent elements. On the gate insulating film 17, the semiconductor active layer 18 and the ohmic contact layer 19 are so layered in this order as to cover the gate electrode 13.

Figure 25:
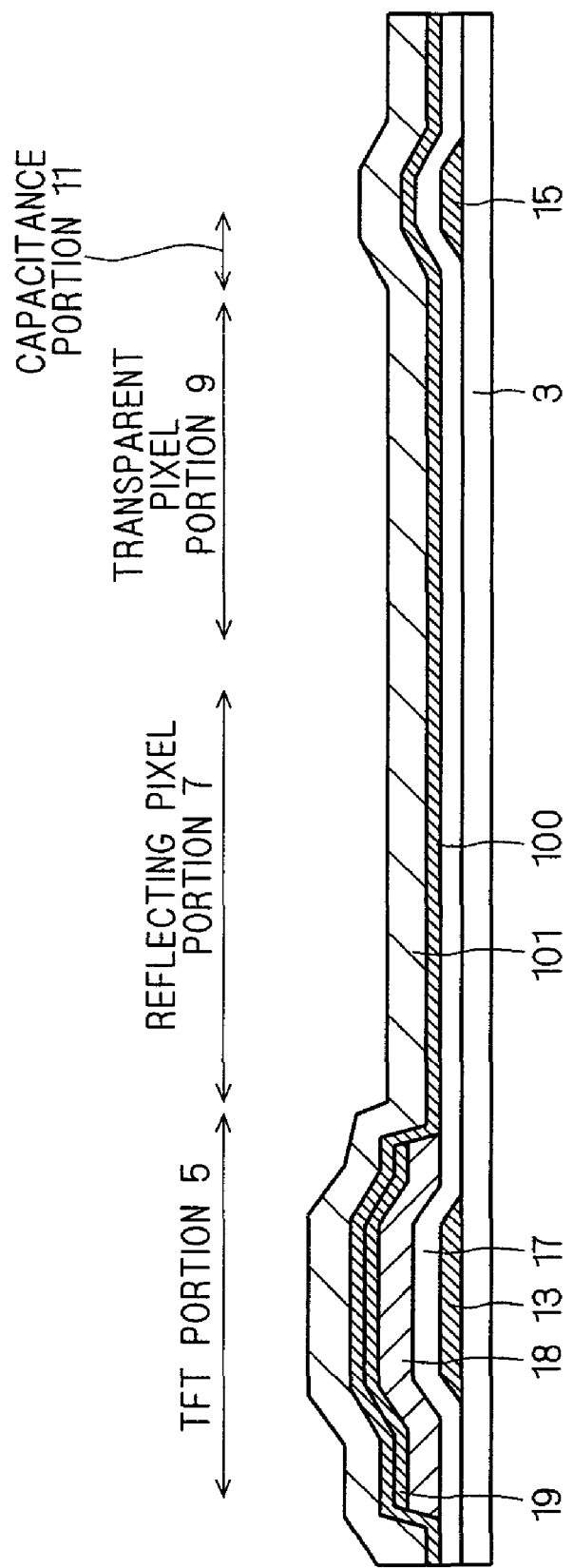
FIG. 25 A cross section taken along the line II-II in the course of the manufacturing process in accordance with a sixth preferred embodiment.

As shown in FIG. 25, on the substrate 3, the lower impurity containing layer 100 made of aluminum or an aluminum alloy containing at least one impurity of nitrogen (N), oxygen (O), silicon (Si) and carbon (C) and the upper aluminum layer 101 made of aluminum or an aluminum alloy are so layered in this order as to cover the exposed portions of the constituent elements 17, 18 and 19 by sputtering or the like.

In the case where the lower impurity containing layer 100 and the upper aluminum layer 101 are layered by DC magnetron sputtering using the aluminum or the aluminum alloy as a target, the lower impurity containing layer 100 is first layered by using a mixed gas of pure argon (Ar) gas and nitrogen ($N_2$) gas as the sputtering gas. Next, the upper aluminum layer 101 is layered by switching the sputtering gas to the pure argon (Ar) gas. In this method, there is no need to use an ion implantation device or a plasma surface treatment device and it is possible to form the lower impurity containing layer 100 only by switching the sputtering gas in a sputtering device as compared with the case of the second preferred embodiment, and only one switching of the sputtering gas for sputtering is needed as compared with the fourth preferred embodiment.

Figure 26:
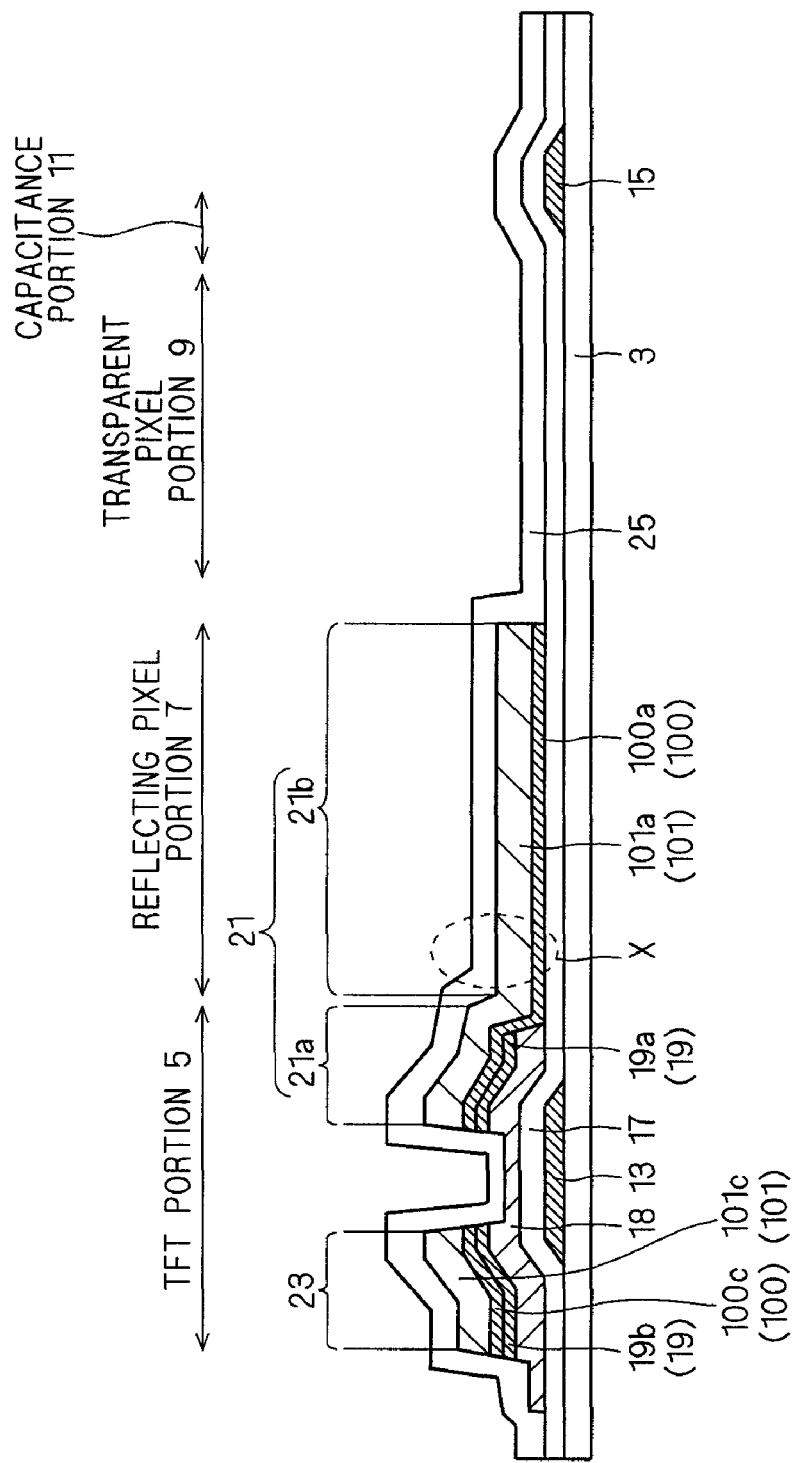
FIG. 26 A cross section taken along the line II-II in the course of the manufacturing process in accordance with a sixth preferred embodiment.

As shown in FIG. 26, by lithography and etching, the unnecessary portion of the ohmic contact layer 19 (i.e., the portion overlapping the center portion of the gate electrode 13) and an unnecessary portion of the layered body consisting of the constituent elements 100 and 101 (i.e., the portion overlapping the center portion of the gate electrode 13 and the portion other than the ranges of forming the constituent elements 5 and 7) are removed.

With this removal, the TFT structure (the recess in the center portion of the gate electrode 13) is formed and the source electrode 23 and the drain electrode 21 (in more detail, the portion of the drain electrode 21 other than the junction discussed later) are formed (in other words, the wire portion (the source electrode 23 and the TFT drain electrode 21a portion of the drain electrode 21) and the reflecting electrode portion (the reflecting pixel portion electrode 21b portion of the drain electrode 21)) of the layered body.

Further, the portion of the ohmic contact layer 19 on the side of the reflecting pixel portion 7 serves as the ohmic contact layer 19a and the portion thereof on the other side serves as the ohmic contact layer 19b. Then, a portion of the layered body consisting of the constituent elements 100 and 101 formed on the ohmic contact layer 19b (i.e., the layered body consisting of the constituent elements 100c and 101c) serves as the source electrode 23 and a portion thereof formed on the ohmic contact layer 19a and in the range of forming the reflecting pixel portion 7 (i.e., the layered body consisting of the constituent elements 100a and 101a) serves as the drain electrode 21. The portion of the drain electrode 21 on the ohmic contact layer 19a serves as the TFT drain electrode 21a and the portion thereof in the range of forming the reflecting pixel portion 7 serves as the reflecting pixel portion electrode 21b.

As shown in FIG. 26, on the substrate 3, the interlayer insulating film 25 is so formed as to cover the exposed portions of the constituent elements 17, 18, 19a, 19b, 21 and 23.

Figure 27:
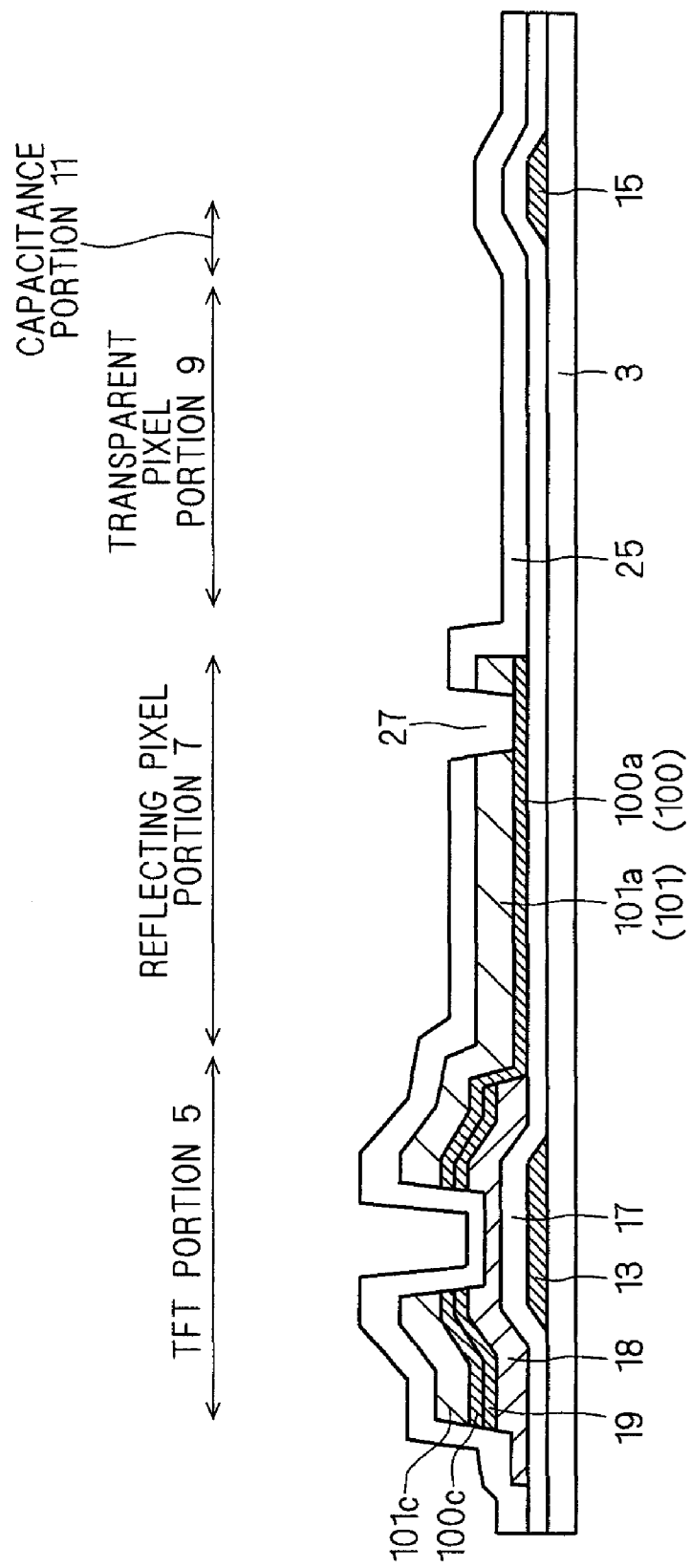
FIG. 27 A cross section taken along the line II-II in the course of the manufacturing process in accordance with a sixth preferred embodiment.

As shown in FIG. 27, by lithography and etching, in e.g., the range of forming the reflecting pixel portion 7, the contact hole 27 is so formed as to penetrate through the interlayer insulating film 25 and the upper aluminum layer 101 and locally expose the lower impurity containing layer 100. In more detail, first, a through hole is formed by dry etching, penetrating through the interlayer insulating film 25, to expose the upper aluminum layer 101. Further, the exposed portion of the upper aluminum layer 101 is dissolved by wet etching using an acid solution to expose the lower impurity containing layer 100, to thereby form the contact hole 27. In the wet etching, an acid solution using phosphoric acid as the main ingredient may be used.

At that time, since it is easy to ensure a difference in etching rate between the aluminum alloy layer (or the aluminum layer) and the impurity containing layer by controlling the concentration of the acid solution, it is possible to remove the upper aluminum layer 101 almost without dissolving the lower impurity containing layer 100a. After that, the portion of the lower impurity containing layer 100 which is exposed from the contact hole 27 serves as the junction with the transparent electrode film 39 discussed later.

On the interlayer insulating film 25, as shown in FIG. 22, the transparent electrode film 39 is so formed as one unit as to cover the entire range of forming the transparent pixel portion 9, the contact hole 27 and the lower auxiliary capacitance electrode 15. In this state, the transparent electrode film 39 is joined to the portion of the lower impurity containing layer 100 exposed from the contact hole 27.

In the method of manufacturing the display device having the above structure, since the wire portion (the source electrode 23 and the TFT drain electrode 21a) and the reflecting electrode portion (the reflecting pixel portion electrode 21b) are formed at the same time, there is no need to add another step of forming the reflecting electrode portion, and it is therefore possible to achieve a display device comprising the reflecting electrode of high reflectance without increasing the manufacturing cost.

Further, as shown in FIG. 25, the lower impurity containing layer 100a is layered on the substantially entire upper surface of the substrate 3 and then, as shown in FIG. 27, the upper aluminum layer 101a is so layered on the lower impurity containing layer 100a as to locally expose the lower impurity containing layer 100a, to thereby use the locally exposed portion of the lower impurity containing layer 100a to locally form the junction with transparent electrode film 39, which is made of the locally exposed portion of the lower impurity containing layer 100a. In other words, since the impurity containing layer (herein, the lower impurity containing layer 100a) needed to form the junction is not locally formed, unlike the local impurity containing layer 38 of the above-discussed first preferred embodiment. Therefore, the lower impurity containing layer 100a can be formed without using the ion implantation device or the plasma surface treatment device, and by only one switching of the sputtering gas when using the sputtering device as compared with the third preferred embodiment. It is therefore possible to suppress an increase in the manufacturing cost.

The Seventh Preferred Embodiment

A display device 1E of the seventh preferred embodiment has the same structure as the display device 1D of the above fifth preferred embodiment except the structure of the contact hole 27. Hereinafter, referring to FIG. 28, the constituent elements of the display device 1E of the seventh preferred embodiment which are identical to those of the display device 1D of the fifth preferred embodiment are represented by the same reference signs and discussion thereof will be omitted, and only difference will be discussed.

As an anticipated manufacturing problem, the display device 1D of the fifth preferred embodiment has the following problem. Specifically, for example, if the film thickness of the source electrode 23 and the drain electrode 21 is set to 600 nm and the film thickness of the lower impurity containing layer 100a is set to 5 nm, the film thickness of the upper aluminum layer 101a becomes 595 nm, which is relatively thick. When the relatively thick upper aluminum layer 101a is etched, etching in the horizontal direction also proceeds at the same time.

Therefore, in the process step of forming the contact hole 27, when the upper aluminum layer 101a is etched, the upper aluminum layer 101a is largely etched in the horizontal direction and the interlayer insulating film 25 thereabove overhangs like eaves (specifically, there arises an eaves structure at the boundary between the constituent elements 101a and 25 in the contact hole 27). In this state, when the transparent electrode film 39 is deposited in the contact hole 27, the transparent electrode film 39 becomes apt to break and a void becomes apt to be left at the eaves-like portion of the interlayer insulating film 25, and this causes a poor connection.

In order to suppress such a poor connection, as shown in a portion (b) of FIG. 28, it is effective to form a step structure (staircase structure) at the boundary portion between the constituent elements 101a and 25 in the contact hole 27. Specifically, it is effective to so form an opening of the contact hole 27 in the interlayer insulating film 25 as to be larger than the opening of the contact hole 27 in the upper aluminum layer 101a and include an entire opening surface of the opening in the upper aluminum layer 101a. In more detail, since the contact hole 27 is tapered by etching, the opening in the interlayer insulating film 25 is so formed as to have an opening diameter 25r of its bottom which is larger than the opening diameter 101r of an upper face of the opening in the upper aluminum layer 101a and include the entire opening surface of the opening in the upper aluminum layer 101a. The transparent electrode film 39 deposited in the contact hole 27 has a step structure without causing any break or any void in the contact hole 27.

In the display device 1E having the above structure, since the boundary portion between the constituent elements 101a and 25 in the contact hole 27 is formed to have a step structure (specifically, the opening of the contact hole 27 in the interlayer insulating film 25 is so formed as to be larger than the opening of the contact hole 27 in the upper aluminum layer 101a and include the entire opening surface of the opening in the upper aluminum layer 101a), the transparent electrode film 39 can be deposited in the contact hole 27 in a step-like manner and this can suppress the poor connection of the transparent electrode film 39 in the contact hole 27.

The Eighth Preferred Embodiment

A method of manufacturing a display device in accordance with the eighth preferred embodiment is a method of manufacturing the display device 1E of the above seventh preferred embodiment. Hereinafter, referring to FIGS. 28 to 36, discussion will be made on the method of manufacturing the display device in accordance with the eighth preferred embodiment. Portions (a) of FIGS. 28 to 36 are enlarged views of the position X in FIG. 22 in the respective process steps of the method of manufacturing the display device in accordance with the eighth preferred embodiment, and portions (b) of FIGS. 28 to 36 are enlarged views of the position Y in FIG. 22 in the respective process steps of the method of manufacturing the display device in accordance with the eighth preferred embodiment.

Figure 29:
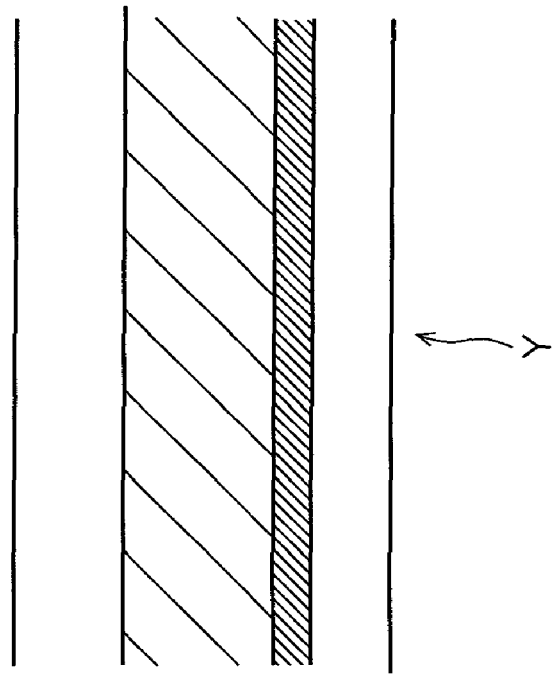
FIG. 29 A view showing the respective portions shown in FIG. 28 in the course of the manufacturing process in accordance with an eighth preferred embodiment.

FIG. 29 is views showing the same process step as shown in FIG. 26 and illustrate the state where the gate insulating film 17, the lower impurity containing layer 100a, the upper aluminum layer 101a and the interlayer insulating film 25 are layered in this order.

Then, as shown in FIG. 30, a photoresist (the first photoresist) 104 is applied onto an entire upper surface of the interlayer insulating film 25 and an opening (the first opening) 104h of the photoresist 104 is formed by lithography in e.g., the range of forming the reflecting pixel portion 7.

Subsequently, as shown in FIG. 31, an opening 25h is so formed in the interlayer insulating film 25 by dry etching using the photoresist 104 as a mask as to locally expose the upper aluminum layer 101a.

Figure 32:
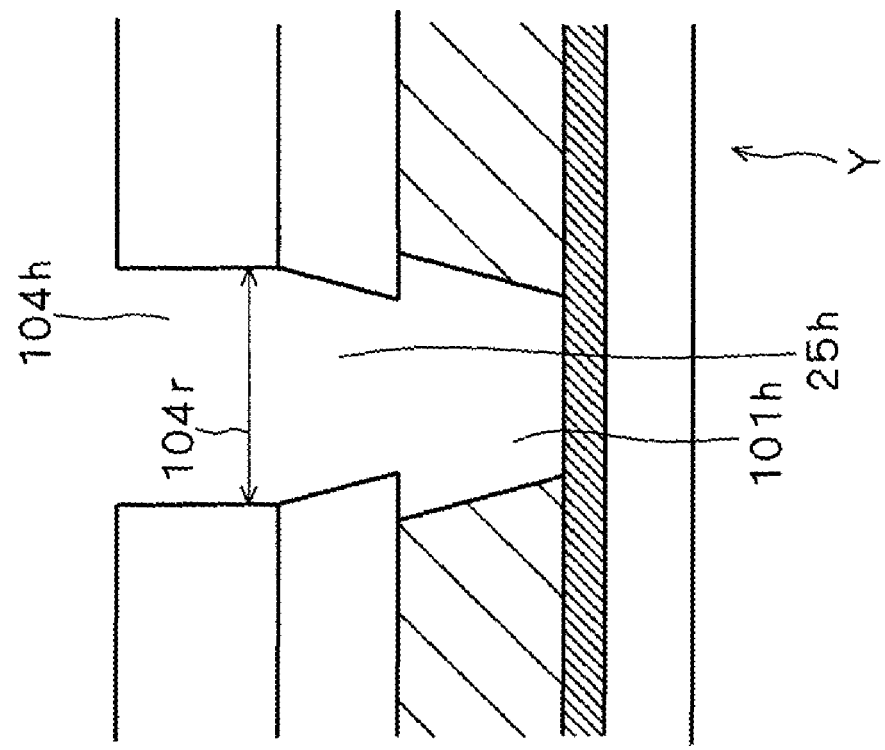
FIG. 32 A view showing the respective portions shown in FIG. 28 in the course of the manufacturing process in accordance with an eighth preferred embodiment.

Then, as shown in FIG. 32, the exposed portion of the upper aluminum layer 101a is dissolved by wet etching using the acid solution, to be removed, and an opening 101h is so formed in the upper aluminum layer 101a as to locally expose the lower impurity containing layer 100a.

Figure 33:
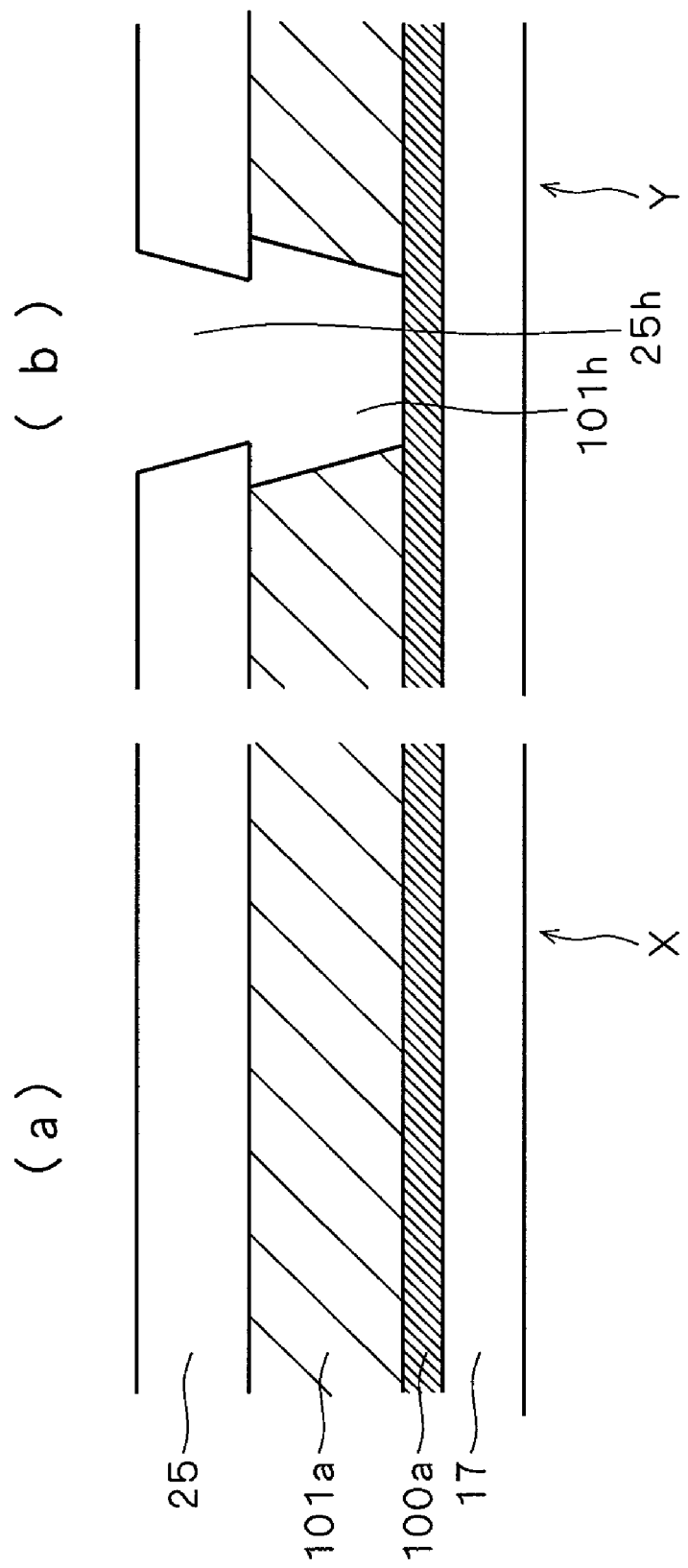
FIG. 33 A view showing the respective portions shown in FIG. 28 in the course of the manufacturing process in accordance with an eighth preferred embodiment.

Subsequently, as shown in FIG. 33, the photoresist 104 is removed by ashing or the like.

Then, as shown in FIG. 34, a photoresist (the second photoresist) 108 is applied onto the entire upper surface of the interlayer insulating film 25 again and an opening (the second opening) 108h of the photoresist 108 is formed by lithography. At that time, the opening 108h is so formed as to have an opening diameter 108r which is larger than the opening diameter 104r of the opening 104h of the first photoresist 104 (FIGS. 32A and 32B) and include the entire opening surface of the opening 25h of the interlayer insulating film 25.

Subsequently, as shown in FIG. 35, the interlayer insulating film 25 is etched by dry etching using the photoresist 108 as a mask again to enlarge the opening 25h, to thereby form an opening (enlarged opening) 25h2 in the interlayer insulating film 25. The opening 25h2 is formed to be larger than the opening 101h in the upper aluminum layer 101a (in more detail, the opening diameter 25r of the bottom of the opening 25h2 is larger than the opening diameter 101r of the upper face of the opening 101h in the upper aluminum layer 101a) and include the entire opening surface of the opening 101h in the upper aluminum layer 101a. In this state, the opening 25h2 in the interlayer insulating film 25 and the opening 101h in the upper aluminum layer 101a constitute the contact hole 27 in which the boundary portion of the constituent elements 101a and 25 has a step structure (staircase structure).

Figure 36:
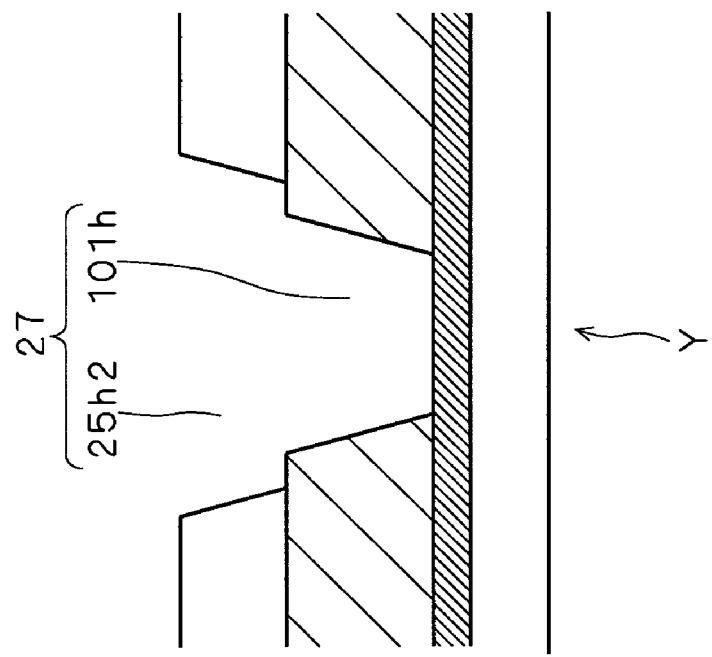
FIG. 36 A view showing the respective portions shown in FIG. 28 in the course of the manufacturing process in accordance with an eighth preferred embodiment.

Then, as shown in FIG. 36, the photoresist 108 is removed by ashing or the like. After that, as shown in FIG. 22, the transparent electrode film 39 is so formed on the interlayer insulating film 25 as one unit as to cover the entire range of forming the transparent pixel portion 9, the contact hole 27 and the lower auxiliary capacitance electrode 15. In this state, as shown in FIG. 28, the transparent electrode film 39 is deposited in the contact hole 27 in the step-like manner, to be joined to the portion of the lower impurity containing layer 100 exposed from the contact hole 27.

Thus, by the method of manufacturing the display device in accordance with the eighth preferred embodiment, the display device 1E of the seventh preferred embodiment can be manufactured. Specifically, the display device in which the boundary portion of the constituent elements 101a and 25 in the contact hole 27 has a step structure. It is thereby possible to suppress the poor connection of the transparent electrode film 39 in the contact hole 27.

The Ninth Preferred Embodiment

In the ninth preferred embodiment, another method of manufacturing the display device 1E of the seventh preferred embodiment, other than that of the eighth preferred embodiment, will be discussed, referring to FIG. 28 and FIGS. 37 to 43. Portions (a) of FIG. 28 and FIGS. 37 to 43 are enlarged views of the position X in FIG. 22 in the respective process steps of the method of manufacturing the display device in accordance with the ninth preferred embodiment, and portions (b) of FIG. 28 and FIGS. 37 to 43(b) are enlarged views of the position Y in FIG. 22 in the respective process steps of the method of manufacturing the display device in accordance with the ninth preferred embodiment.

Figure 37:
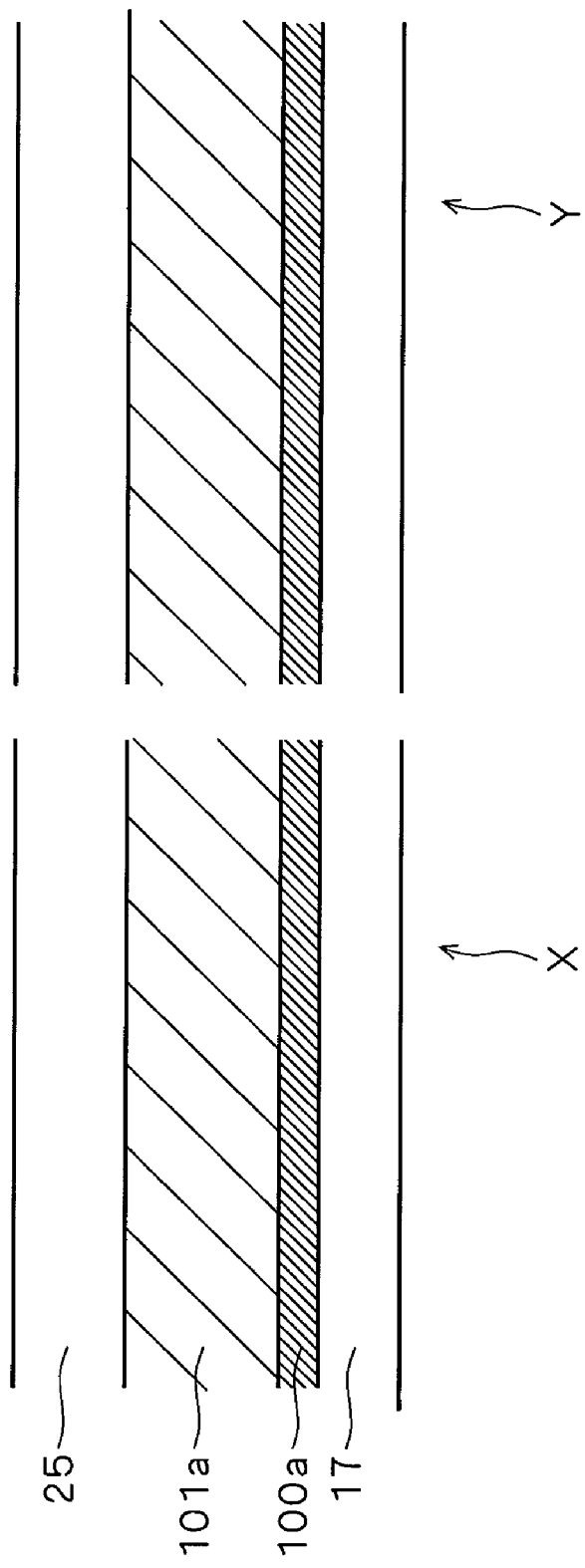
FIG. 37 A view showing the respective portions shown in FIG. 28 in the course of the manufacturing process in accordance with a ninth preferred embodiment.

FIG. 37 is views showing the same process step as shown in FIG. 26 and illustrate the state where the gate insulating film 17, the lower impurity containing layer 100a, the upper aluminum layer 101a and the interlayer insulating film 25 are layered in this order.

Then, as shown in FIG. 38, the photoresist 104 is applied onto the entire upper surface of the interlayer insulating film 25 and an opening 104s of the photoresist 104 is formed by lithography in e.g., the range of forming the reflecting pixel portion 7. At that time, by a technique of reducing the transmittance of exposure light onto a contact peripheral portion C2 of the photoresist 104 to 20 to 40% of the transmittance of exposure light onto a contact portion C1, the thickness d1 of a peripheral portion of the opening 104s of the photoresist 104 is made thinner than the thickness d2 of the other portion in the photoresist 104. In general, the thickness d1 of the peripheral portion of the opening 104s of the photoresist 104 is set to 1.5 µm or less and the thickness d2 of the other portion in the photoresist 104 is set to 4.0 µm or less.

As the technique of reducing the transmittance of exposure light to 20 to 40%, a method in which a filter film or a filter layer for reducing the transmittance of exposure light is provided on the photoresist 104, a method in which a mask having fine slits is provided on the photoresist 104 to use the diffraction of light through the mask, or the like can be used. These methods are techniques well known, generally, as a halftone exposure technique or a gray tone exposure technique.

Subsequently, as shown in FIG. 39, an opening 25s is so formed in the interlayer insulating film 25 by dry etching using the photoresist 104 as a mask as to locally expose the upper aluminum layer 101a.

Then, as shown in FIG. 40, the exposed portion of the upper aluminum layer 101a is dissolved by wet etching using the acid solution, to be removed, and an opening 101s is so formed in the upper aluminum layer 101a as to locally expose the lower impurity containing layer 100a.

Subsequently, as shown in FIG. 41, an entire surface of the photoresist 104 is removed by ashing or the like by a certain thickness to enlarge an opening diameter 104t of the bottom of the opening 104s. In this state, the opening 104s has the opening diameter 104t which is larger than the opening diameter 101r of the upper face of the opening 101s in the upper aluminum layer 101a and include the entire opening surface of the opening 101s in the upper aluminum layer 101a.

Then, as shown in FIG. 42, the interlayer insulating film 25 is etched by dry etching using the photoresist 104 as a mask again to enlarge the opening 25s, to thereby form an opening (enlarged opening) 25s2 in the interlayer insulating film 25. The opening 25s2 is formed to be larger than the opening 101s in the upper aluminum layer 101a (in more detail, the opening diameter 25r of the bottom of the opening 25s2 is larger than the opening diameter 101r of the upper face of the opening 101s in the upper aluminum layer 101a) and include the entire opening surface of the opening 101s in the upper aluminum layer 101a. In this state, the opening 25s2 in the interlayer insulating film 25 and the opening 101s in the upper aluminum layer 101a constitute the contact hole 27 in which the boundary portion of the constituent elements 101a and 25 has a step structure.

In dry etching, if the interlayer insulating film 25 is made of silicon nitride (SiN), for example, a fluorine-containing gas may be used. In this case, only the interlayer insulating film 25 is mainly etched and almost no lower impurity containing layer 100a is etched.

Subsequently, as shown in FIG. 43, the photoresist 104 is removed by ashing or the like. After that, as shown in FIG. 22, the transparent electrode film 39 is so formed on the interlayer insulating film 25 as one unit as to cover the entire range of forming the transparent pixel portion 9, the contact hole 27 and the lower auxiliary capacitance electrode 15. In this state, as shown in FIG. 28, the transparent electrode film 39 is deposited in the contact hole 27 in the step-like manner, to be joined to the portion of the lower impurity containing layer 100 exposed from the contact hole 27.

Also by the method of manufacturing the display device in accordance with the ninth preferred embodiment, like that of the eighth preferred embodiment, the display device 1E of the seventh preferred embodiment can be manufactured. Specifically, the display device in which the boundary portion of the constituent elements 101a and 25 in the contact hole 27 has a step structure. It is thereby possible to suppress the poor connection of the transparent electrode film 39 in the contact hole 27.

Since only one lithography process is needed to form the contact hole 27, as compared with the eighth preferred embodiment, it is possible to reduce the manufacturing cost by reduction in the process time.

The Tenth Preferred Embodiment

A display device 1F of the tenth preferred embodiment is an improved one of the display device 1E of the seventh preferred embodiment. The display device 1F has the same structure as the display device 1E except the structure of the contact hole 27. Hereinafter, referring to FIG. 22 and FIG. 44, the constituent elements of the display device 1F of the tenth preferred embodiment which are identical to those of the display device 1E of the seventh preferred embodiment are represented by the same reference signs and discussion thereof will be omitted, and only difference will be discussed.

Figure 44:
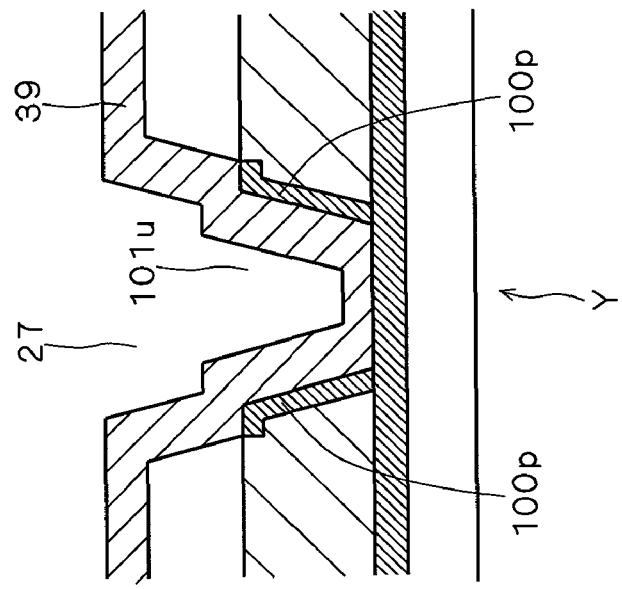
FIG. 44 (a) is an enlarged view showing the region X of FIG. 22 in the case of the tenth preferred embodiment, and (b) is an enlarged view showing the region Y of FIG. 22 in the case of the tenth preferred embodiment.

In the display device of the tenth preferred embodiment, as shown in a portion (b) of FIG. 44, a local impurity containing layer 100p is so formed as to cover the exposed portion of the upper aluminum layer 101a in the contact hole 27 (i.e., an inner side surface of an opening 101u and an uncovered portion of the interlayer insulating film 25 in the upper surface of the upper aluminum layer 101a) and to be connected to the lower impurity containing layer 100a.

Then, joint of the transparent electrode film 39 and the drain electrode 21 is made through the lower impurity containing layer 100a exposed from the contact hole 27 and the local impurity containing layer 100p.

Therefore, it is possible to suppress formation of an oxide layer at the junction of these constituent elements 39 and 21. Further, as shown in a portion (a) of FIG. 44 and FIG. 22, in the reflecting pixel portion electrode 21b, since the extraneous light is reflected from the upper aluminum layer 101a not containing any impurity, it is possible to achieve high reflectance.

Furthermore, as compared with the seventh preferred embodiment, since a contact area of the impurity containing layers 100a and 100p and the transparent electrode film 39 increases, it is possible to establish an excellent contact with relatively low resistance.

The Eleventh Preferred Embodiment

A method of manufacturing a display device in accordance with the eleventh preferred embodiment is a method of manufacturing the display device 1F of the tenth preferred embodiment. The method of manufacturing the display device 1F of the tenth preferred embodiment is the same as the manufacturing methods of the eighth and ninth preferred embodiments until the contact hole 27 is formed. Then, the impurity is implanted into the exposed portion of the upper aluminum layer 101a in the contact hole 27 by using the ion implantation method or the plasma surface treatment method discussed in the second preferred embodiment, to thereby form the local impurity containing layer 101p on the exposed portion of the upper aluminum layer 101a in the contact hole 27. Subsequently, the transparent electrode film 39 is so formed on the interlayer insulating film 25 as to be joined to the portion of the lower impurity containing layer 100a exposed from the contact hole 27 and the local impurity containing layer 101p.

Thus, by the method of manufacturing the display device in accordance with the eleventh preferred embodiment, the display device 1F of the tenth preferred embodiment can be manufactured. Especially, if the local impurity containing layer 100p is formed by using the ion implantation method or the plasma surface treatment method discussed in the second preferred embodiment, as discussed above, the display device 1F can be manufactured relatively easily.

The Twelfth Preferred Embodiment

A display device 1C of the twelfth preferred embodiment has the same structure as the display device 1 of the above first preferred embodiment except the structure of the wire portion (the source electrode 23 and the TFT drain electrode 21a) and the reflecting electrode portion (the reflecting pixel portion electrode 21b). Hereinafter, the constituent elements of the display device 1C of the twelfth preferred embodiment which are identical to those of the display device 1 of the first preferred embodiment are represented by the same reference signs and discussion thereof will be omitted, and only difference will be discussed.

Figure 15:
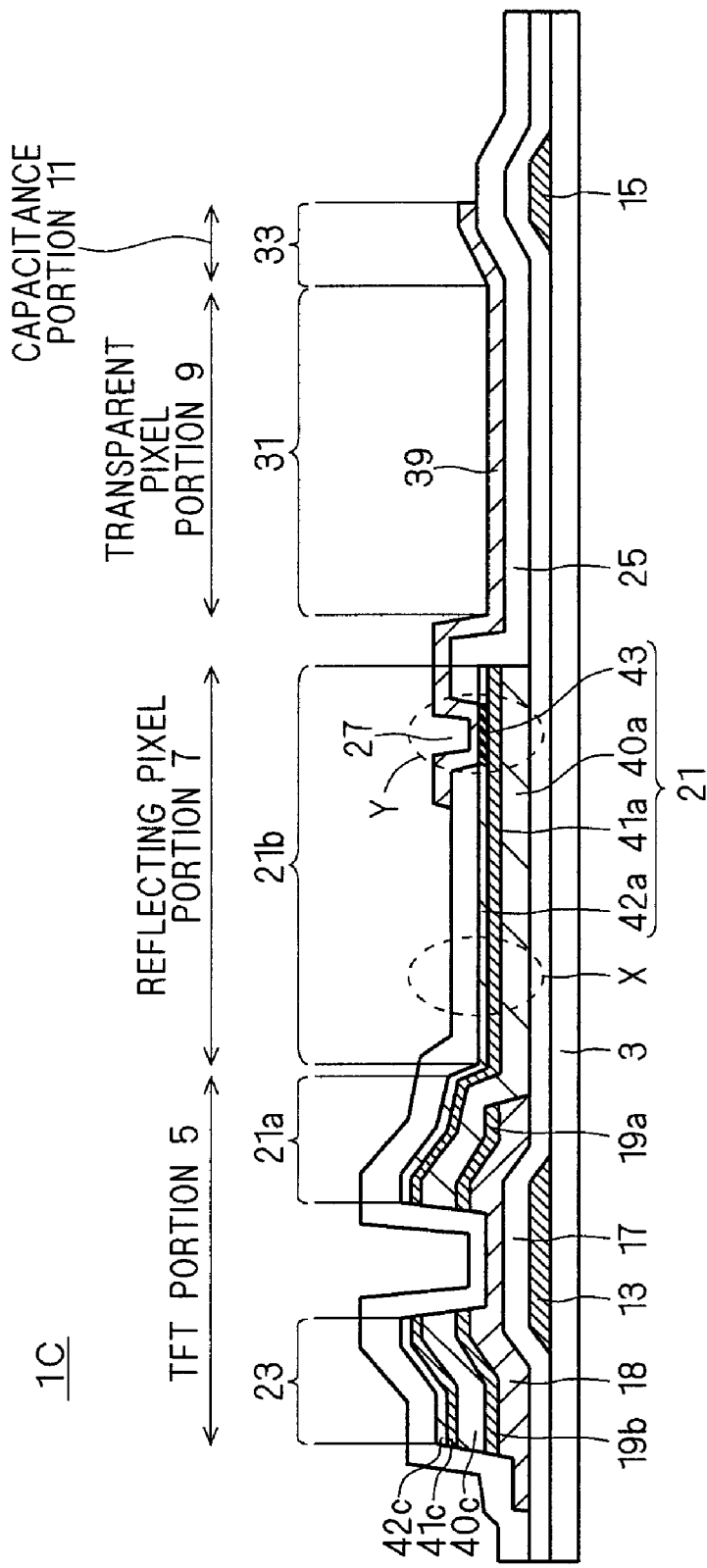
FIG. 15 A cross section taken along the line II-II of FIG. 1 in the case of a twelfth preferred embodiment.

In the twelfth preferred embodiment, as shown in FIG. 15, the source electrode 23 is constituted of the lower aluminum layer 40c made of aluminum or an aluminum alloy, the intermediate impurity containing layers 41a and 41c each made of aluminum or an aluminum alloy containing at least one impurity of nitrogen (N), oxygen (O), silicon (Si) and carbon (C), which are layered on the substantially entire upper surfaces of the lower aluminum layer 40c, and the upper aluminum layer 42c made of aluminum or an aluminum alloy, which are layered on the substantially entire upper surfaces of the intermediate impurity containing layer 41c.

Further, the drain electrode 21 is constituted of the lower aluminum layer 40a made of aluminum or an aluminum alloy, the intermediate impurity containing layer 41a made of aluminum or an aluminum alloy containing at least one impurity of nitrogen (N), oxygen (O), silicon (Si) and carbon (C), which are layered on the substantially entire upper surfaces of the lower aluminum layers 40a and 40c, the upper aluminum layer 42a made of aluminum or an aluminum alloy, which are layered on the substantially entire upper surfaces of the intermediate impurity containing layer 41a, and a local impurity containing layer 43 made of aluminum or an aluminum alloy containing at least one impurity of nitrogen (N), oxygen (O), silicon (Si) and carbon (C), which is locally formed in the surface layers of the upper aluminum layers 42a and 42c to be connected to the intermediate impurity containing layer 41a. The local impurity containing layer 43 serves as a junction with the transparent electrode film 39 discussed later. Specifically, in the surface of the drain electrode 21, the junction is locally formed of the local impurity containing layer (impurity containing layer) 43, and the portion other than the junction is formed of the upper aluminum layer (aluminum layer) 42a.

The aluminum layers 40a, 40c, 42a and 42c and the impurity containing layers 41a, 41c and 43 (in other words, the drain electrode 21 and the source electrode 23) constitute the metal conductive layer.

On the substrate 3, the interlayer insulating film 25 is so formed as to cover the exposed portions of the constituent elements 17, 18, 19a, 19b, 21 and 23. The contact hole 27 is so formed as to penetrate through the interlayer insulating film 25 and expose the local impurity containing layer 43 of the drain electrode 21.

On the interlayer insulating film 25, the transparent electrode film 39 is so formed as to cover the contact hole 27, the range of forming the transparent pixel portion 9 and the range of forming the capacitance portion 11. In this state, the transparent electrode film 39 is joined to the intermediate impurity containing layer 41a exposed from the contact hole 27.

In this structure, as shown in a portion (b) of FIG. 16, the transparent electrode film 39 and the drain electrode 21 are joined to each other through the local impurity containing layer 43 exposed from the contact hole 27. Therefore, it is possible to suppress formation of an oxide layer at the junction of these constituent elements 39 and 21. Further, as shown in a portion (a) of FIG. 16, in the reflecting pixel portion electrode 21b, since the extraneous light is reflected from the upper aluminum layer 42a not containing any impurity, it is possible to achieve high reflectance.

The film thickness of the source electrode 23 and the drain electrode 21 is usually set to 300 nm to 600 nm and in this case, an appropriate film thickness of the intermediate impurity containing layers 41a and 41b are 5 nm to 200 nm. In the case where the local impurity containing layer 43 and the intermediate impurity containing layers 41a and 41b are formed by introducing nitrogen (N), an appropriate degree of nitriding of these constituent elements is 0.1 to 0.9. Further, an appropriate film thickness of the upper aluminum layers 42a and 42b are 5 nm or more. Therefore, the film thickness of the local impurity containing layer 43 is also almost equal to that of the upper aluminum layers 42a and 42b.

The display device 1C having the above structure also produces the same effect as that of the display device 1 of the above first preferred embodiment.

Further, since the metal conductive layer (e.g., the drain electrode 21) has the lower aluminum layer 40a, the intermediate impurity containing layer 41a formed on the substantially entire upper surface of the lower aluminum layer 40a, the upper aluminum layer 42a which is so formed on the intermediate impurity containing layer 41a as to locally expose the intermediate impurity containing layer 41a and the local impurity containing layer 43 which is so formed as to be connected to the intermediate impurity containing layer 41a and the local impurity containing layer 43 serves as the junction, in other words, since the local impurity containing layer 43 is formed on the intermediate impurity containing layer 41a, it is possible to prevent the contact hole 27 from being dug too deep when the interlayer insulating film 25 is layered on the metal conductive layer and the contact hole 27 is formed in the interlayer insulating film 25, and it is further possible to prevent the contact hole 27 from penetrating through the intermediate impurity containing layer 41a due to digging too deep.

The Thirteenth Preferred Embodiment

A method of manufacturing a display device in accordance with the thirteenth preferred embodiment is a method of manufacturing the display device 1C of the above twelfth preferred embodiment. Hereinafter, referring to FIGS. 15, 17 and 18, discussion will be made on the method of manufacturing the display device in accordance with the thirteenth preferred embodiment.

Figure 17:
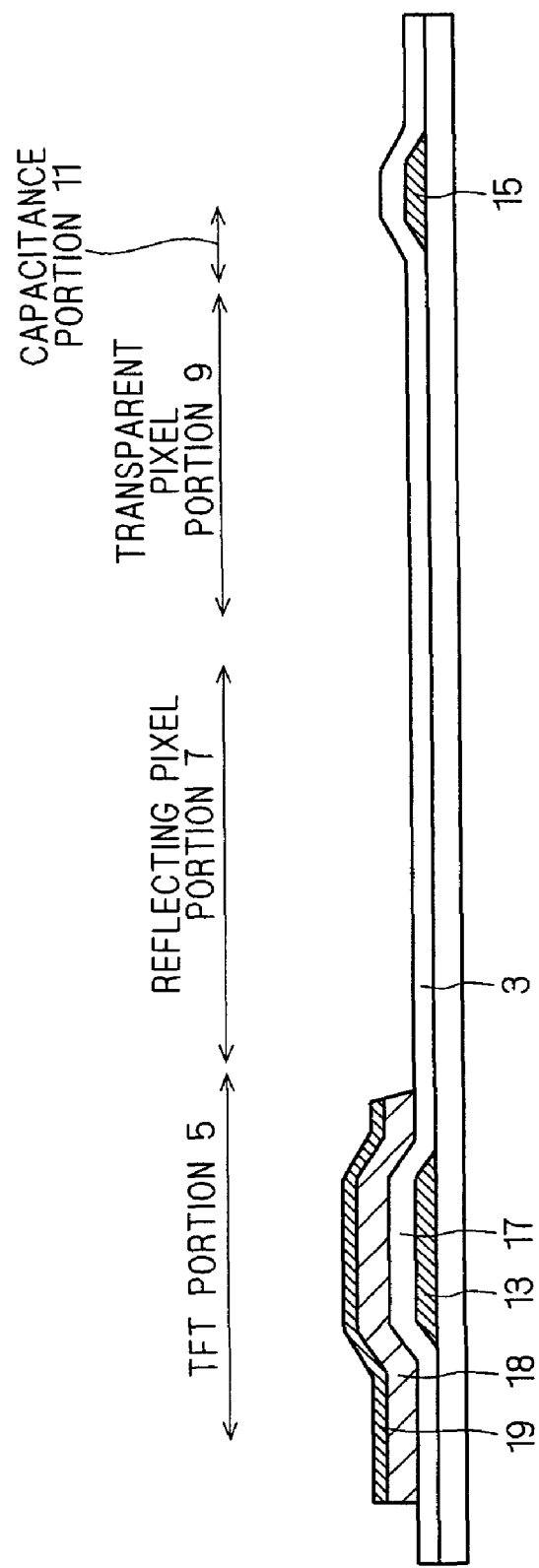
FIG. 17 A view illustrating a process until the ohmic contact layer 19 is formed.

First, as shown in FIG. 17, on the transparent insulating substrate (substrate) 3, the gate electrode 13, the gate wire 14 connected to the gate electrode 13 (see FIG. 1) and the lower auxiliary capacitance electrode 15 are formed and the gate insulating film 17 is so formed on the substantially entire upper surface of the substrate 3 as to cover these constituent elements. On the gate insulating film 17, the semiconductor active layer 18 and the ohmic contact layer 19 are so layered in this order as to cover the gate electrode 13.

Figure 18:
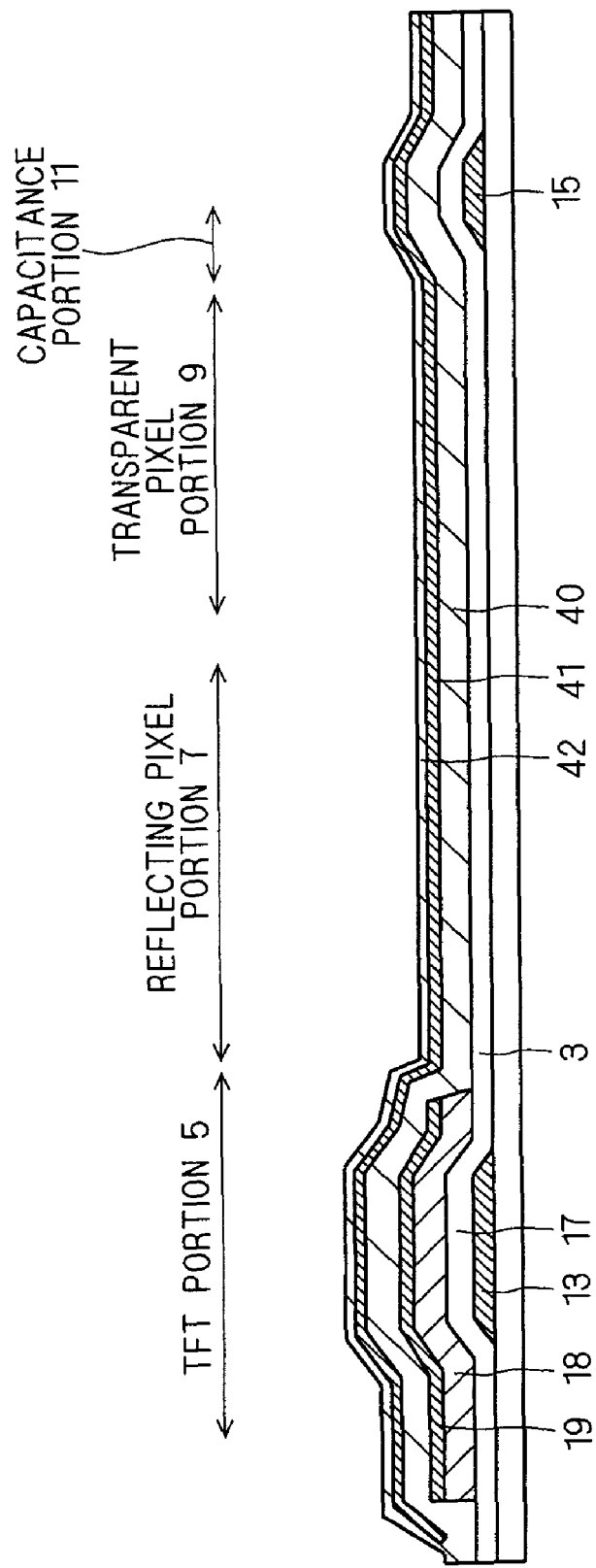
FIG. 18 A view illustrating a process of forming the lower aluminum layer 40, the intermediate impurity containing layer 41 and the upper aluminum layer 42.

As shown in FIG. 18, like in the above case of the fourth preferred embodiment, on the substrate 3, the lower aluminum layer 40 made of aluminum or an aluminum alloy, the intermediate impurity containing layer 41 made of aluminum or an aluminum alloy containing at least one impurity of nitrogen (N), oxygen (O), silicon (Si) and carbon (C) and the upper aluminum layer 42 made of aluminum or an aluminum alloy are so layered in this order as to cover the exposed portions of the constituent elements 17, 18 and 19 by sputtering or the like.

Figure 19:
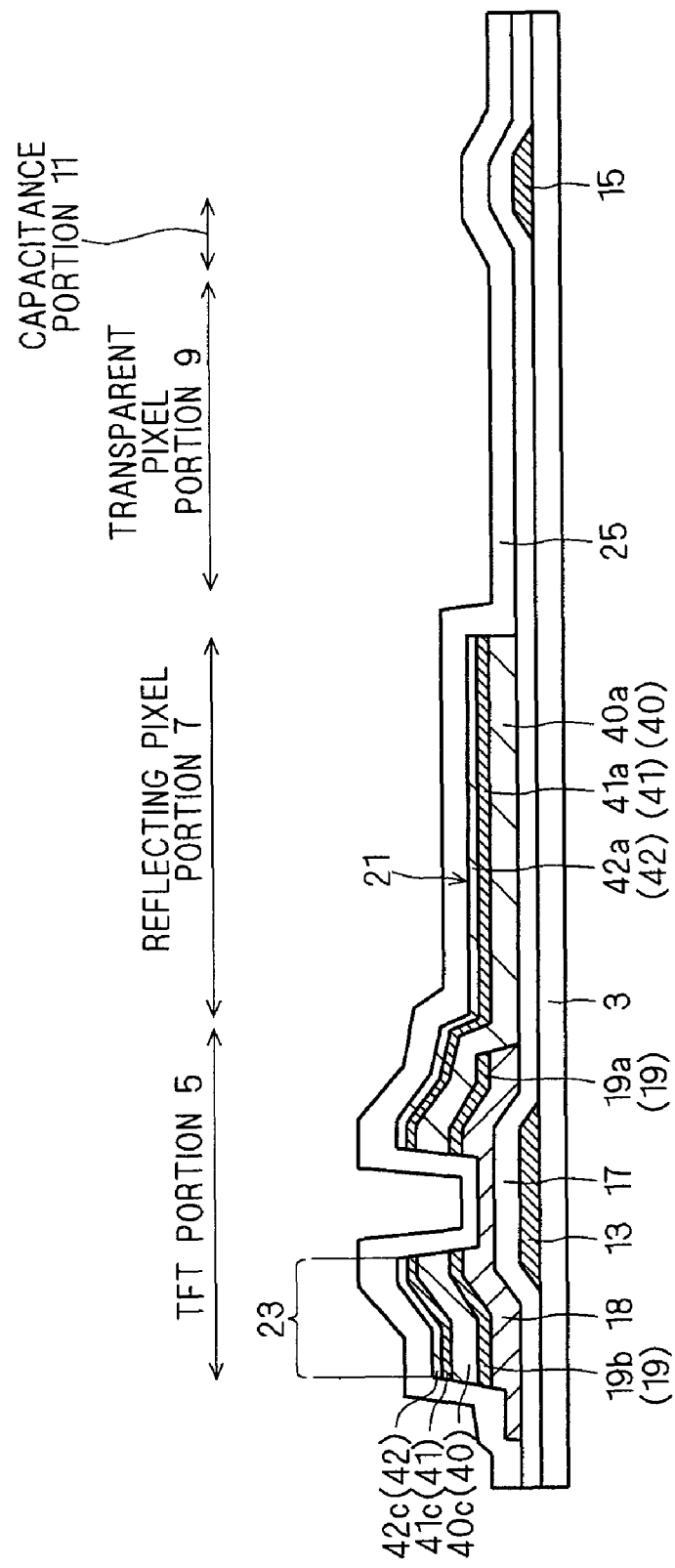
FIG. 19 A view illustrating a process of forming the source electrode 23, the drain electrode 21 and the interlayer insulating film 25.

As shown in FIG. 19, like in the above case of the fourth preferred embodiment, by lithography and etching, the unnecessary portion of the ohmic contact layer 19 (i.e., the portion overlapping the center portion of the gate electrode 13) and an unnecessary portion of the layered body consisting of the constituent elements 40, 41 and 42 (i.e., the portion overlapping the center portion of the gate electrode 13 and the portion other than the ranges of forming the constituent elements 5, 7 and 9) are removed.

With this removal, the TFT structure (the recess in the center portion of the gate electrode 13) is formed and the source electrode 23 and the drain electrode 21 (in more detail, the portion of the drain electrode 21 other than the junction discussed later) are formed (in other words, the wire portion (the source electrode 23 and the TFT drain electrode 21a portion of the drain electrode 21) and the reflecting electrode portion (the reflecting pixel portion electrode 21b portion of the drain electrode 21)) of the layered body.

Further, the portion of the ohmic contact layer 19 on the side of the reflecting pixel portion 7 serves as the ohmic contact layer 19a and the portion thereof on the other side serves as the ohmic contact layer 19b. A portion of the layered body consisting of the constituent elements 40, 41 and 42 formed on the ohmic contact layer 19b (i.e., the layered body consisting of the constituent elements 40c, 41c and 42c) serves as the source electrode 23 and a portion thereof formed on the ohmic contact layer 19a and in the range of forming the reflecting pixel portion 7 (i.e., the layered body consisting of the constituent elements 40a, 41a and 42a) serves as the drain electrode 21 (in more detail, the portion of the drain electrode 21 other than the junction discussed later).

As shown in FIG. 19, on the substrate 3, the interlayer insulating film 25 is so formed as to cover the exposed portions of the constituent elements 17, 18, 19a, 19b, 40a, 40c, 41a, 41c, 42a and 42c.

Figure 20:
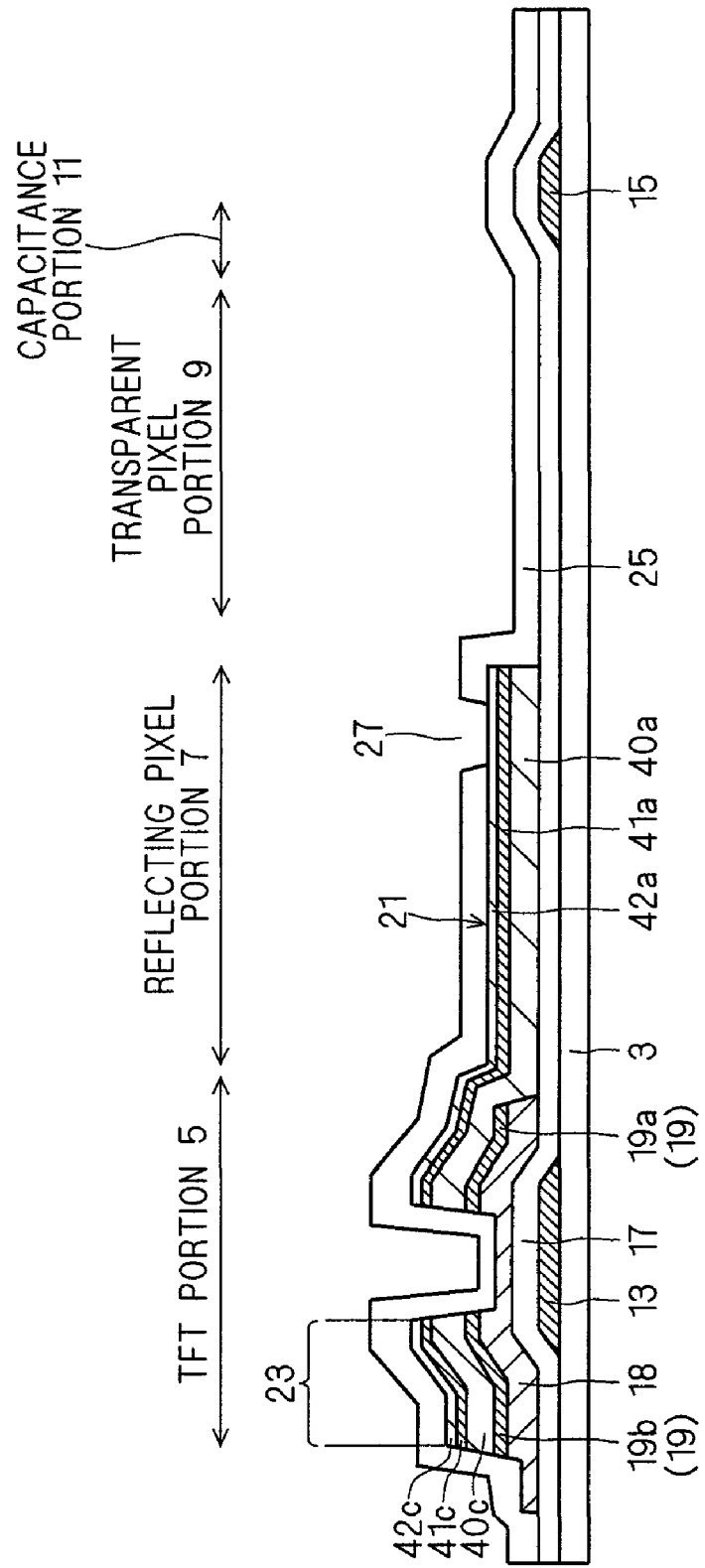
FIG. 20 A view illustrating a process of forming the contact hole 27.

As shown in FIG. 20, like in the above case of the fourth preferred embodiment, by lithography and etching, in e.g., the range of forming the reflecting pixel portion 7, the contact hole 27 is so formed as to penetrate through the interlayer insulating film 25 and locally expose the upper aluminum layer 42.

Figure 21:
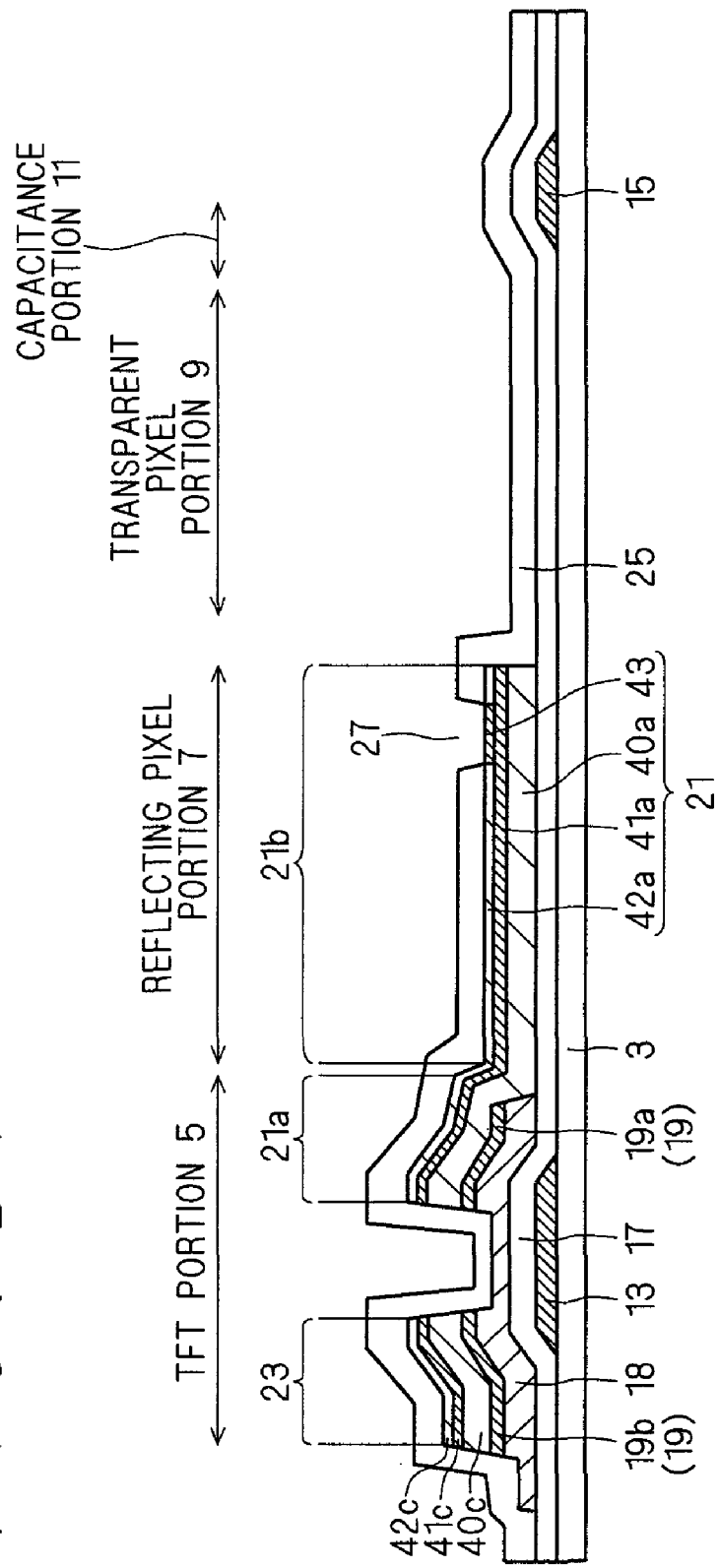
FIG. 21 A view illustrating a process of forming a local impurity containing layer 43.

As shown in FIG. 21, by ion implantation or plasma surface treatment, at least one impurity of nitrogen (N), oxygen (O), silicon (Si) and carbon (C) is locally implanted into a surface layer of the portion of the upper aluminum layer 42 exposed from the contact hole 27, to thereby so form the local impurity containing layer 43 as to be connected to the intermediate impurity containing layer 41. This local impurity containing layer 43 serves as the junction with the transparent electrode film 39 discussed later.

The layered body consisting of the constituent elements 40a, 41a, 42a and 43 constitute the drain electrode 21. The portion of the drain electrode 21 on the ohmic contact layer 19a serves as the TFT drain electrode 21a and the portion thereof in the range of forming the reflecting pixel portion 7 serves as the reflecting pixel portion electrode 21b. The aluminum layers 40a, 40c, 42a and 42c and the impurity containing layers 41a, 41c and 43 (in other words, the drain electrode 21 and the source electrode 23) constitute the metal conductive layer.

On the interlayer insulating film 25, as shown in FIG. 15, the transparent electrode film 39 is so formed as one unit as to cover the entire range of forming the transparent pixel portion 9, the contact hole 27 and the lower auxiliary capacitance electrode 15. In this state, the transparent electrode film 39 is joined to the local impurity containing layer 43 exposed from the contact hole 27.

In the method of manufacturing the display device having the above structure, since the wire portion (the source electrode 23 and the TFT drain electrode 21a) and the reflecting electrode portion (the reflecting pixel portion electrode 21b) are formed at the same time, there is no need to add another step of forming the reflecting electrode portion, and it is therefore possible to achieve a display device comprising the reflecting electrode of high reflectance without increasing the manufacturing cost.

Further, as compared with the fourth preferred embodiment, since the upper aluminum layer 42a is not etched (for example, by performing wet etching using an acid solution) to expose the intermediate impurity containing layer 41a, there is not any of the apprehensions that the intermediate impurity containing layer 41a is also dissolved in the etching and that the upper aluminum layer 42a is dissolved in the horizontal direction (in other words, that the eaves structure is produced, as noted in the background art). Further, if the film thickness of the local impurity containing layer 43 is set to about 5 nm which is almost equal to that of the upper aluminum layer 42a, since the energy for ion implantation is about 1 to 10 KeV, it is possible to form the local impurity containing layer 43 with a relatively low energy.

The Fourteenth Preferred Embodiment

A display device 1G of the fourteenth preferred embodiment has a structure in which a local impurity containing layer, like the local impurity containing layer 43 in the twelfth preferred embodiment (FIG. 15), is so locally formed in the surface layer of the upper aluminum layer 101a as to be connected to the lower impurity containing layer 100a in the display device 1C of the fifth preferred embodiment (FIG. 22). With this, both the effects of the fifth and eleventh preferred embodiments can be produced.

As a method of manufacturing the display device 1G of the fourteenth preferred embodiment, a method in which the contact hole 27 and the local impurity containing layer are formed in the manner of the manufacturing method of the thirteenth preferred embodiment in the manufacturing method of the sixth preferred embodiment.

The invention claimed is:
1. A display device comprising:
a metal conductive layer formed on a substrate;
a transparent electrode film formed on the same substrate, to be joined to said metal conductive layer; and
an interlayer insulating film for isolating said metal conductive layer and said transparent conductive film,
wherein said metal conductive layer has
a lower aluminum layer made of aluminum or an aluminum alloy;
an intermediate impurity containing layer made of aluminum or an aluminum alloy containing impurities and formed on a substantially entire upper surface of said lower aluminum layer; and an upper aluminum layer made of aluminum or an aluminum alloy and formed on said intermediate impurity containing layer, a contact hole is so formed as to penetrate through said interlayer insulating film and locally expose said upper aluminum layer, and said transparent electrode film is joined to said metal conductive layer and said upper aluminum layer exposed from said contact hole, wherein:

said upper aluminum layer further has a local impurity containing layer made of aluminum or an aluminum alloy containing impurities and so locally formed in said upper aluminum layer as to be connected to said intermediate impurity containing layer, said transparent electrode film is joined to said intermediate impurity containing layer through said local impurity containing layer, and said local impurity containing layer has a thickness which is almost equal to that of the upper aluminum layer.

2. The display device according to claim 1, wherein said metal conductive layer is used for a wire portion and a reflecting electrode portion.

* * * * *